(12) United States Patent
Seo et al.

(10) Patent No.: US 11,561,636 B2
(45) Date of Patent: Jan. 24, 2023

(54) TOUCH INPUT DEVICE FOR DETECTING PRESSURE WITH DISPLAY NOISE COMPENSATION

(71) Applicant: HiDeep Inc., Seongnam-si (KR)

(72) Inventors: Bong Jin Seo, Seongnam-si (KR); Bon Kee Kim, Seongnam-si (KR); Myung Jun Jin, Seongnam-si (KR); Tae Hun Kim, Seongnam-si (KR)

(73) Assignee: HiDeep Inc.

( * ) Notice: Subject to any disclaimer, the term of this patent is extended or adjusted under 35 U.S.C. 154(b) by 805 days.

(21) Appl. No.: 16/464,064

(22) PCT Filed: Nov. 24, 2016

(86) PCT No.: PCT/IB2016/057087
§ 371 (c)(1),
(2) Date: May 24, 2019

(87) PCT Pub. No.: WO2018/096386
PCT Pub. Date: May 31, 2018

(65) Prior Publication Data
US 2019/0384441 A1  Dec. 19, 2019

(51) Int. Cl.
*G06F 3/041* (2006.01)
*G06F 3/044* (2006.01)
*G01R 27/26* (2006.01)

(52) U.S. Cl.
CPC ....... *G06F 3/0414* (2013.01); *G01R 27/2605* (2013.01); *G06F 3/044* (2013.01);
(Continued)

(58) Field of Classification Search
CPC ...... G06F 3/0412; G06F 3/0416; G06F 3/044; G06F 3/0414; G06F 3/04166;
(Continued)

(56) References Cited

U.S. PATENT DOCUMENTS 7,388,571 B2 * 6/2008 Lowles ............... G02F 1/13338
345/173
10,120,490 B2 * 11/2018 Kim ...................... G06F 3/0412
(Continued)

FOREIGN PATENT DOCUMENTS

CN 104145240 A 11/2014
CN 104969158 A 10/2015
(Continued)

OTHER PUBLICATIONS

International Search Report and Written Opinion from PCT/IB2016/057087, dated Feb. 7, 2017, pp. 1-4.

*Primary Examiner* — Darlene M Ritchie
(74) *Attorney, Agent, or Firm* — The Belles Group, P.C.

(57) ABSTRACT

A touch input device capable of detecting a pressure of a touch on a touch surface may be provided. The touch input device includes: a display panel; a substrate disposed under the display panel; and a pressure sensing unit. The pressure sensing unit includes a pressure sensor and a reference pressure sensor. When a pressure is applied to the touch surface, the display panel is bent. Electrical characteristics detected at the pressure sensor change by the bending of the display panel. A magnitude of the pressure applied to the touch surface is calculated based on a difference between a reference electrical characteristic calculated from electrical characteristics detected at the reference pressure sensor and the detected electrical characteristic calculated from the electrical characteristics detected at the pressure sensor.

17 Claims, 30 Drawing Sheets

(52) U.S. Cl.
CPC .......... *G06F 3/0412* (2013.01); *G06F 3/0416* (2013.01); *G06F 3/0418* (2013.01); *G06F 3/04182* (2019.05); *G06F 3/0443* (2019.05); *G06F 3/0445* (2019.05); *G06F 3/0446* (2019.05); *G06F 3/04166* (2019.05); *G06F 2203/04103* (2013.01); *G06F 2203/04104* (2013.01); *G06F 2203/04105* (2013.01)

(58) Field of Classification Search
CPC .. G06F 3/04182; G06F 3/0443; G06F 3/0445; G06F 3/0446; G06F 3/0418; G06F 2203/04105; G06F 2203/04107; G06F 2203/04103; G06F 2203/04104; G01R 27/2605
See application file for complete search history.

(56) References Cited

U.S. PATENT DOCUMENTS

| | | | |
|---|---|---|---|
| 2010/0033354 A1* | 2/2010 | Ejlersen | G06F 3/0447 341/33 |
| 2013/0132736 A1 | 5/2013 | Steele | |
| 2013/0234734 A1 | 9/2013 | Iida et al. | |
| 2014/0210791 A1* | 7/2014 | Hanauer | G06F 3/041662 345/174 |
| 2015/0153887 A1* | 6/2015 | Kim | G06F 21/36 345/173 |
| 2016/0062500 A1* | 3/2016 | Kessler | G06F 3/0445 345/173 |
| 2016/0085336 A1* | 3/2016 | Kim | G06F 3/044 345/174 |
| 2016/0124576 A1* | 5/2016 | Besshi | G06F 3/04166 345/174 |
| 2016/0231852 A1 | 8/2016 | Moon et al. | |
| 2017/0242543 A1* | 8/2017 | Chan | G06F 3/0445 |
| 2017/0269758 A1* | 9/2017 | Wen | G06F 3/0445 |
| 2017/0364191 A1* | 12/2017 | Jiang | G01L 1/146 |
| 2018/0080838 A1* | 3/2018 | Chen | G06F 3/04166 |

FOREIGN PATENT DOCUMENTS

| | | |
|---|---|---|
| CN | 105222931 A | 1/2016 |
| CN | 105549790 A | 5/2016 |
| EP | 2824549 A1 | 1/2015 |
| JP | 2016-149114 A | 8/2016 |
| KR | 10-2014-0145117 A | 12/2014 |
| KR | 10-1598412 B1 | 2/2016 |
| RU | 2014135545 A | 1/2013 |
| TW | 201347006 A | 11/2013 |
| WO | WO 2013/13276 A1 | 7/2012 |
| WO | WO 2016/129827 A1 | 8/2016 |

* cited by examiner

[Fig. 1a]
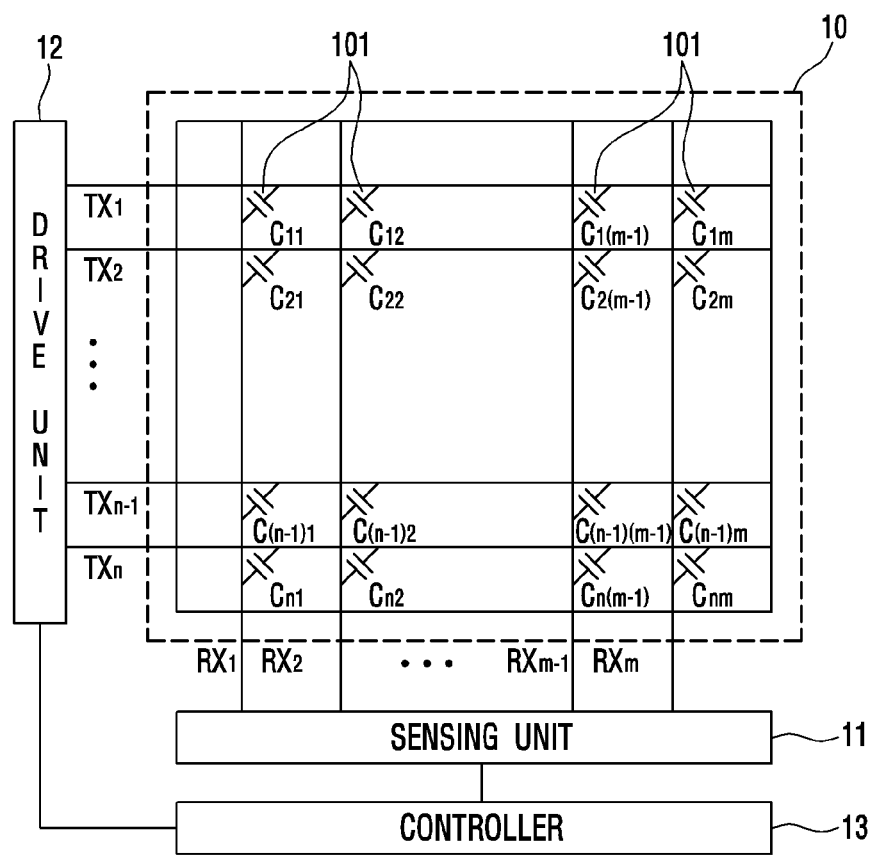

[Fig. 1b]
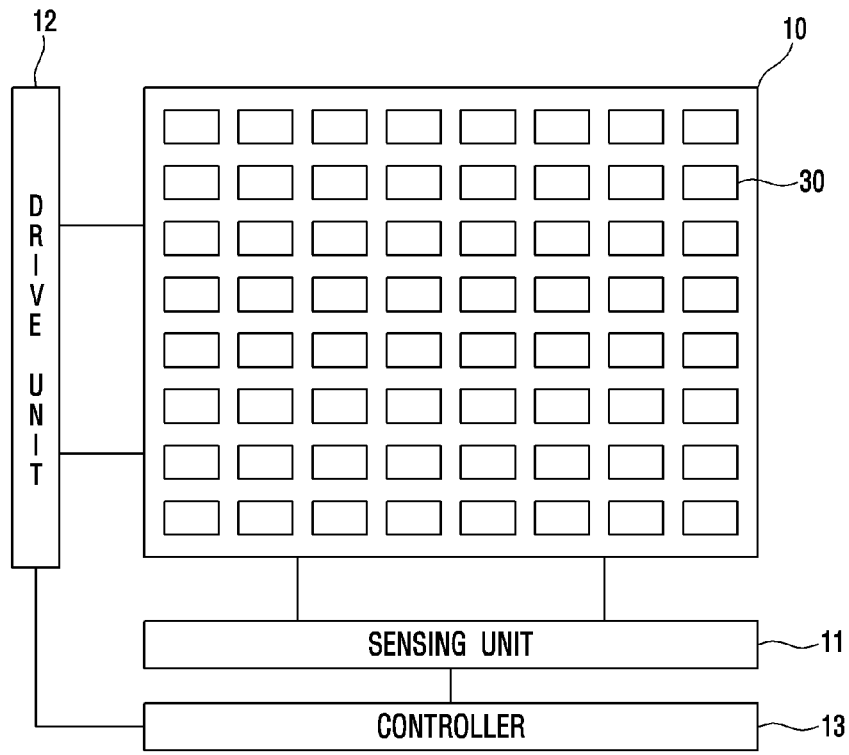
[Fig. 2a]
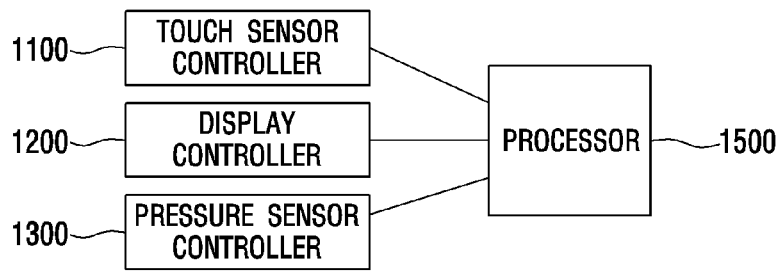
[Fig. 2b]
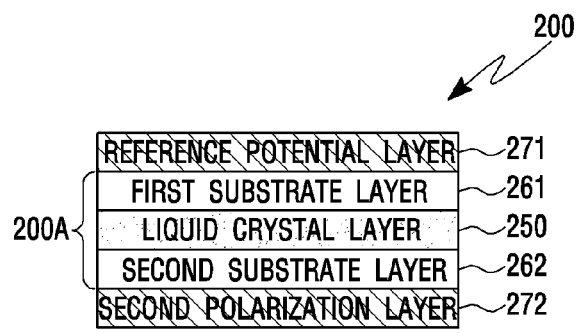

[Fig. 2c]
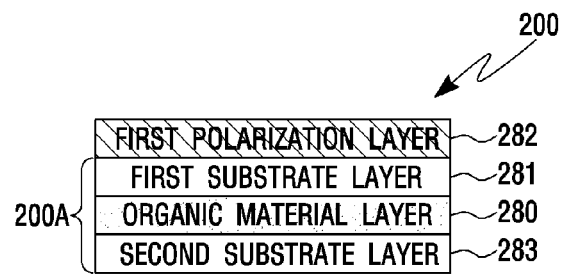
[Fig. 3a]
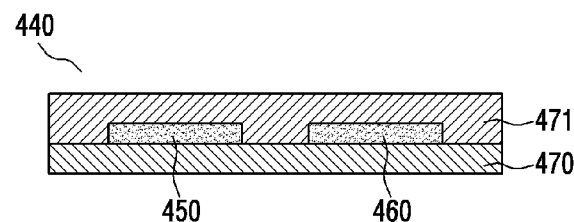
[Fig. 3b]
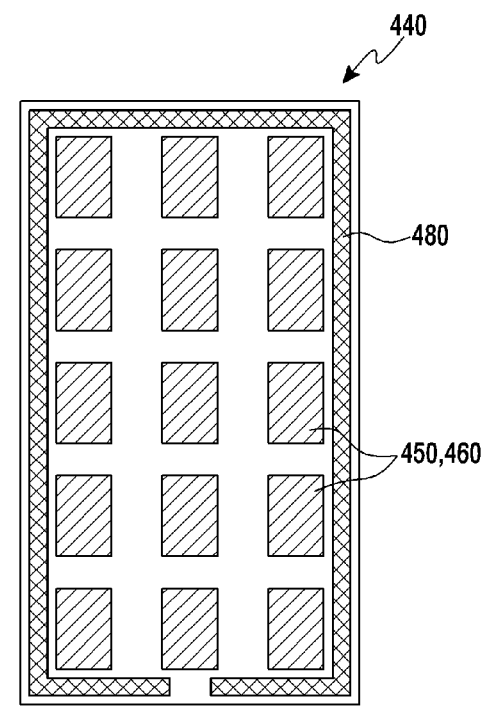

[Fig. 3c]
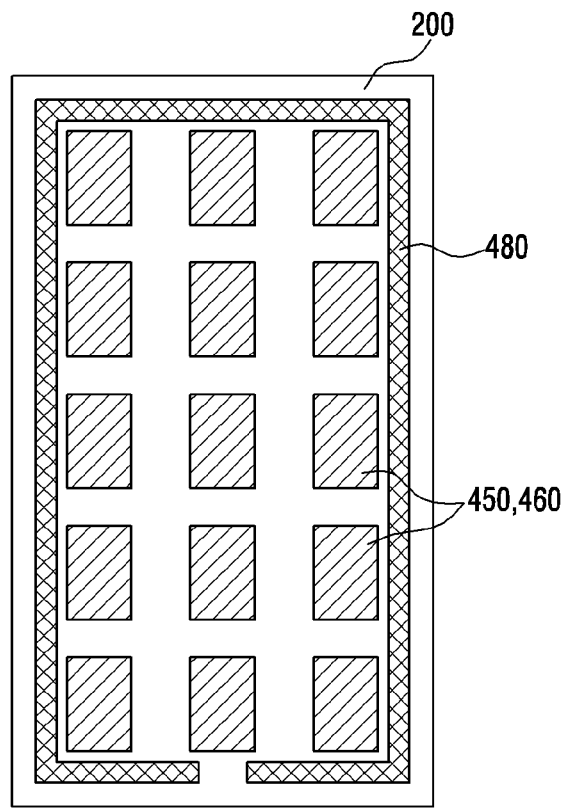
[Fig. 3d]
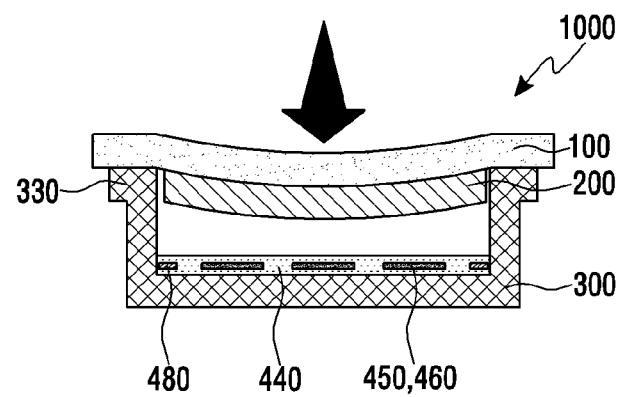

[Fig. 3e]
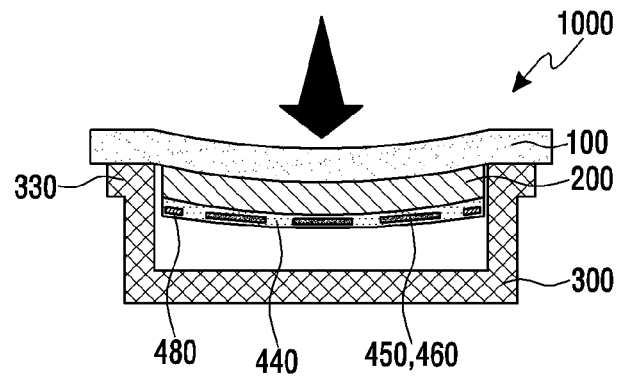
[Fig. 3f]
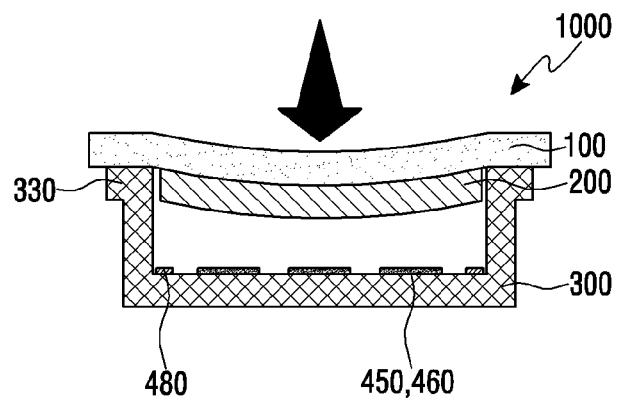
[Fig. 3g]
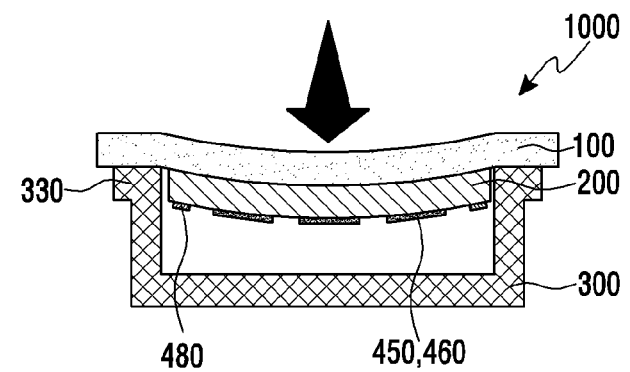

[Fig. 3h]
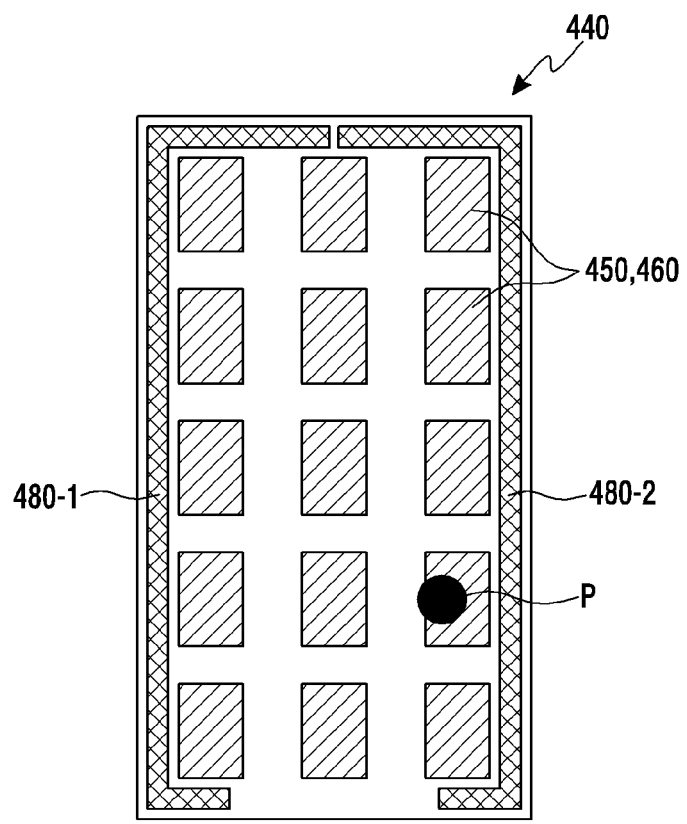

[Fig. 3i]
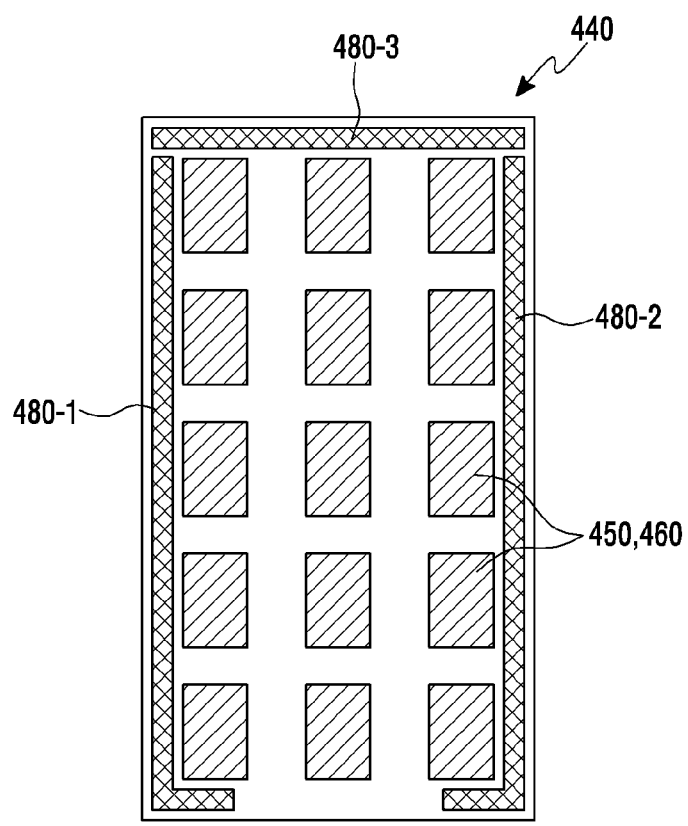

[Fig. 3j]
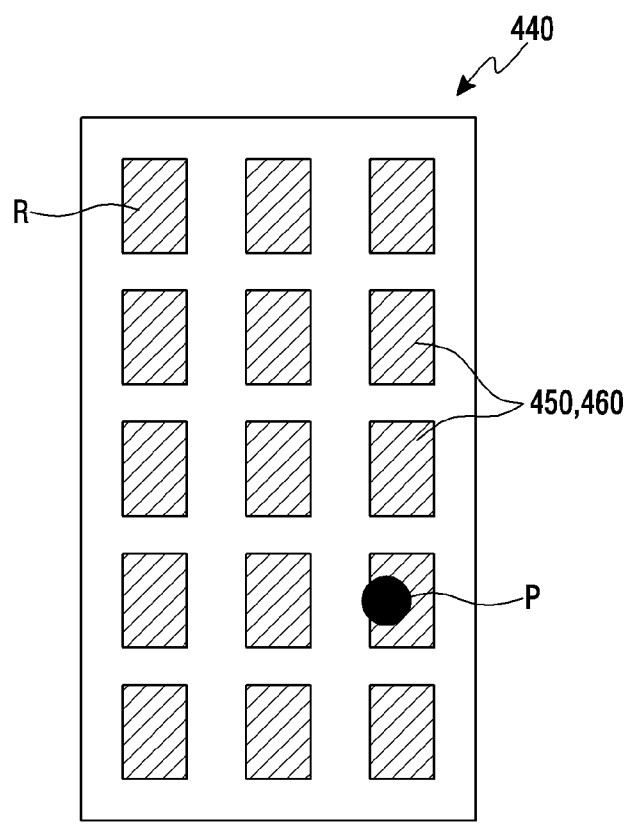

[Fig. 3k]
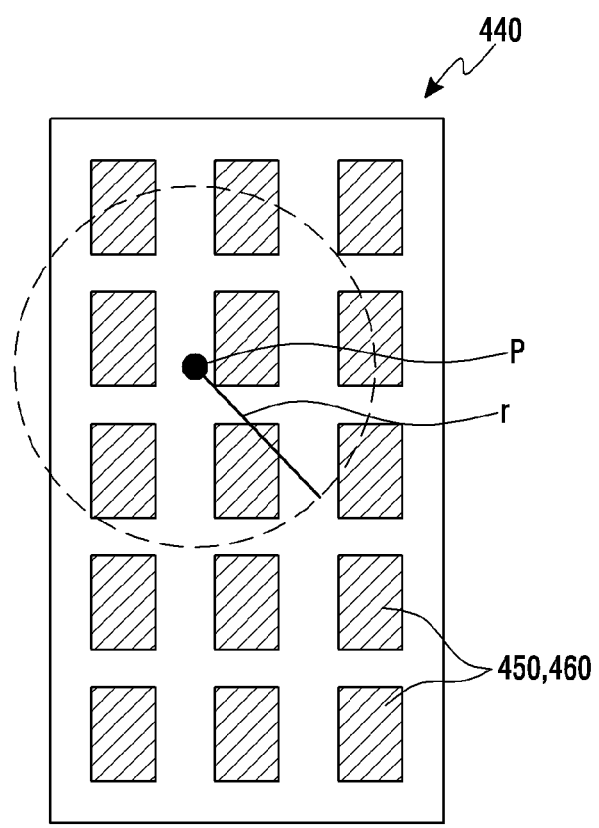

[Fig. 3l]
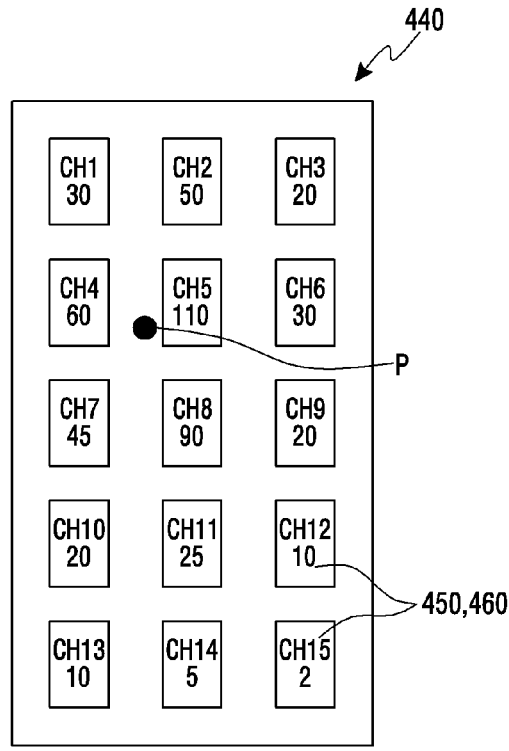
[Fig. 3m]
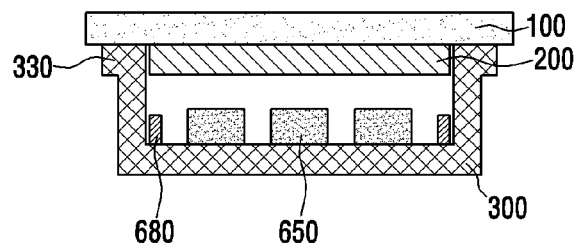
[Fig. 4a]
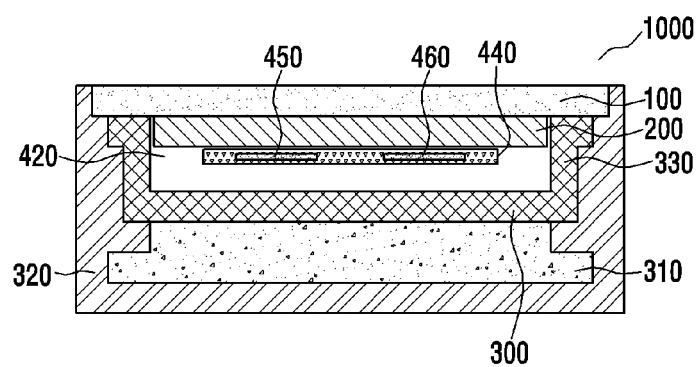

[Fig. 4b]
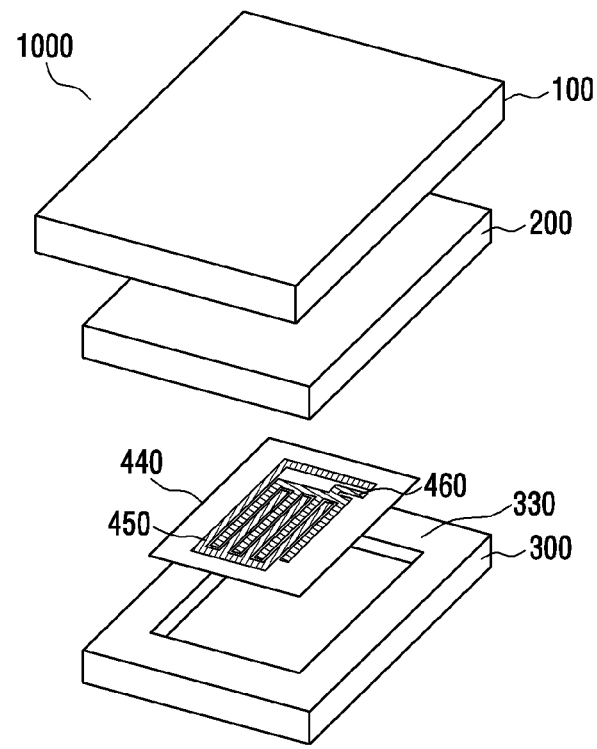
[Fig. 4c]
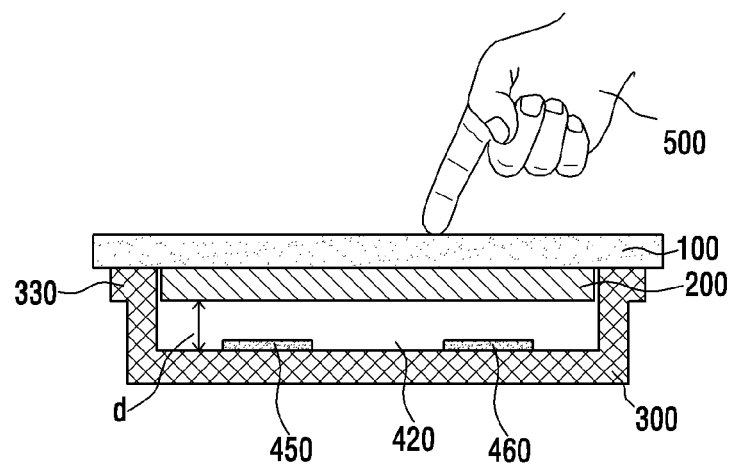

[Fig. 4d]
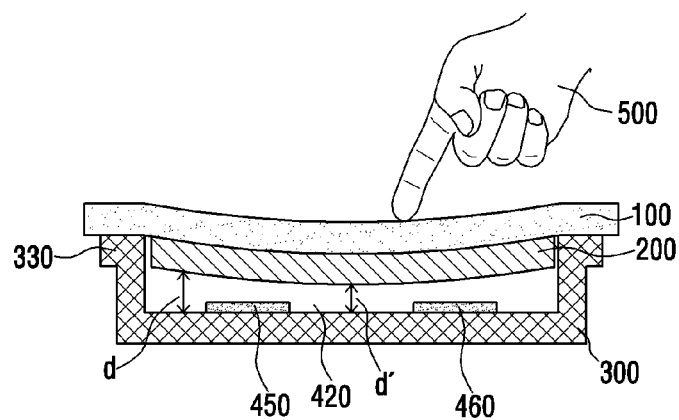
[Fig. 4e]
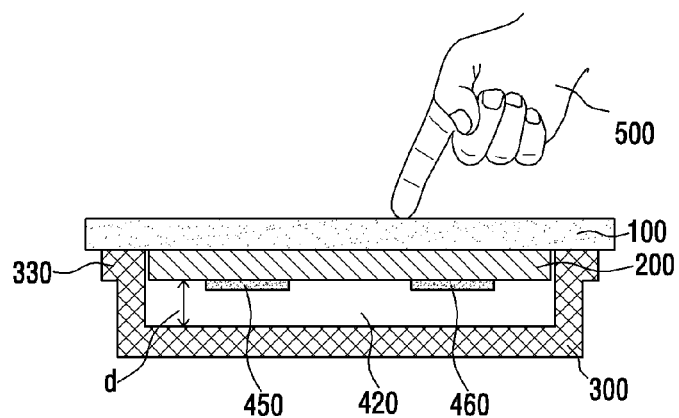
[Fig. 4f]
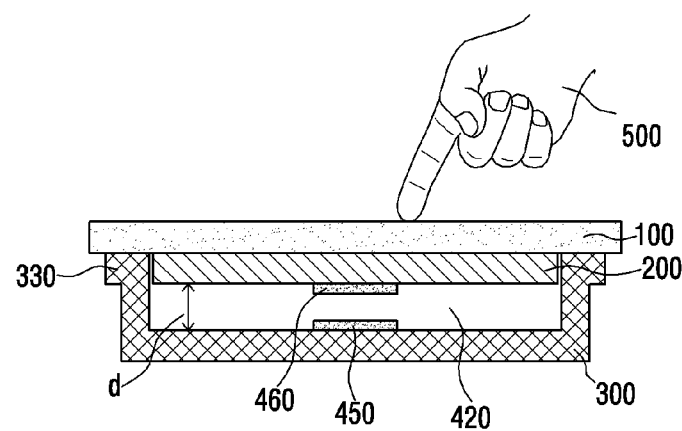

[Fig. 4g]
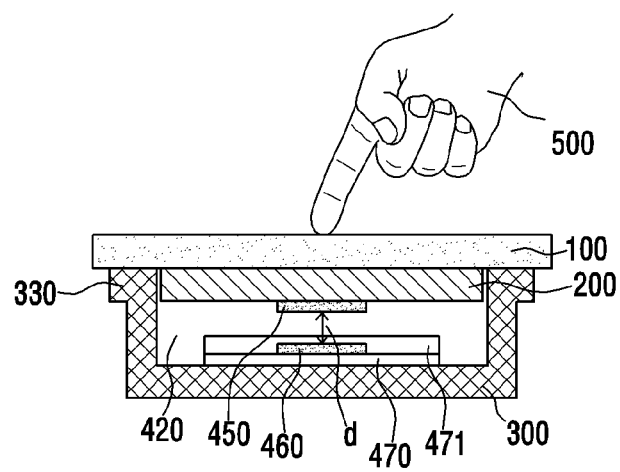
[Fig. 5a]
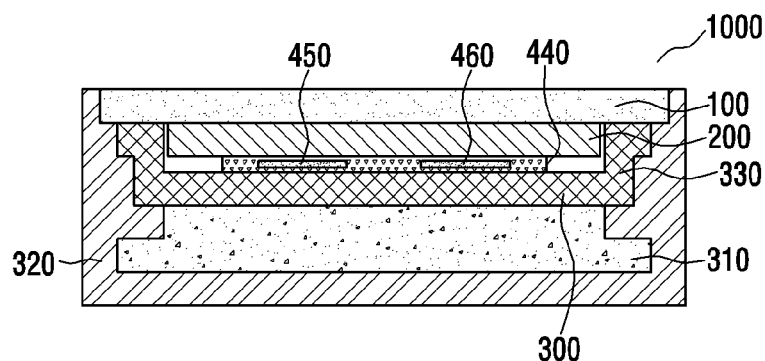
[Fig. 5b]
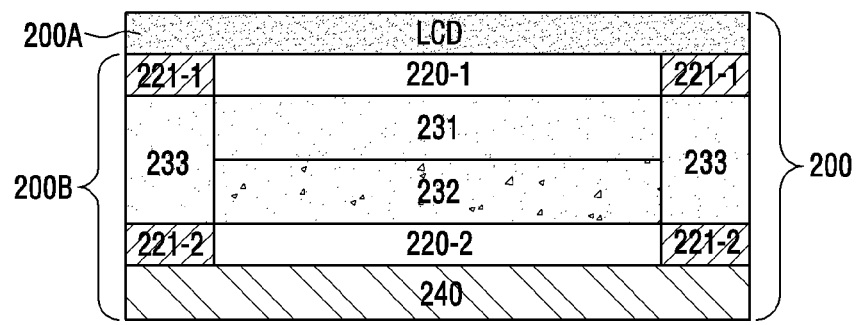

[Fig. 5c]
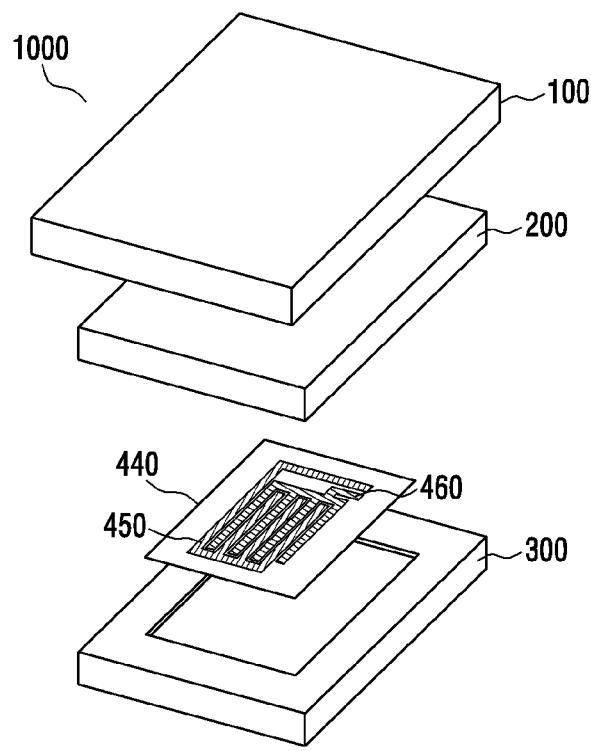
[Fig. 5d]
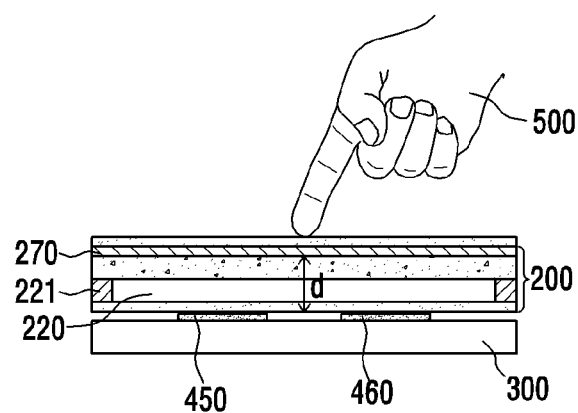

[Fig. 5e]
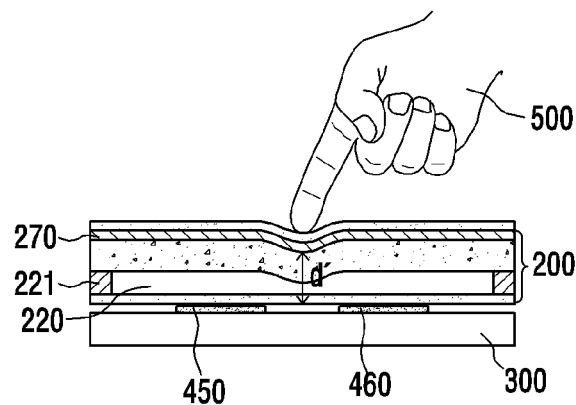
[Fig. 5f]
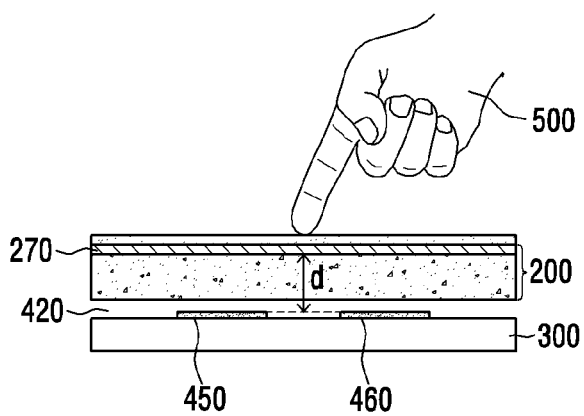
[Fig. 5g]
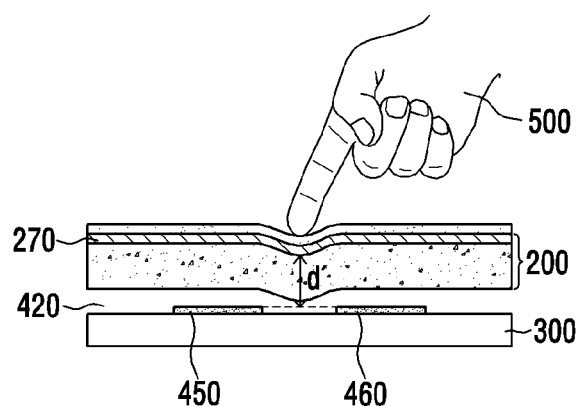

[Fig. 5h]
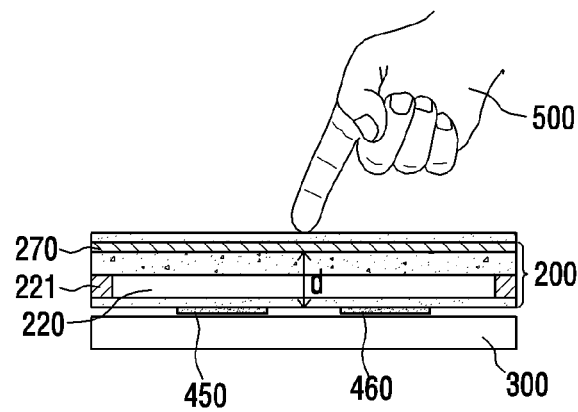
[Fig. 5i]
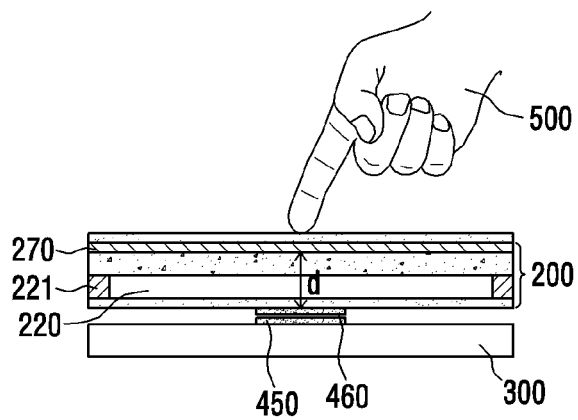
[Fig. 6a]
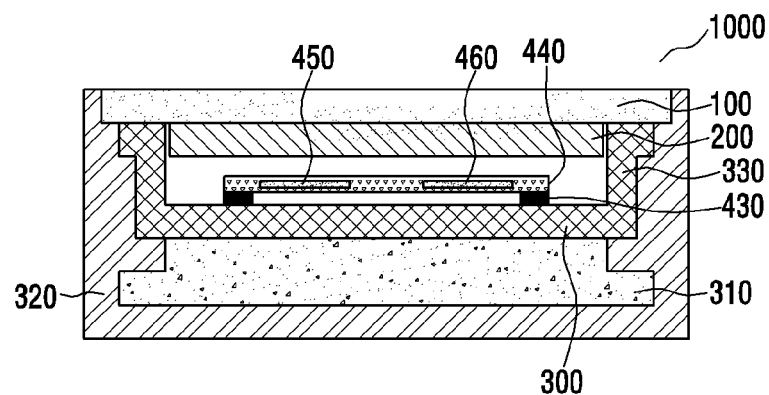

[Fig. 6b]
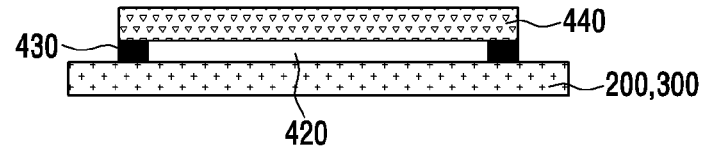
[Fig. 6c]
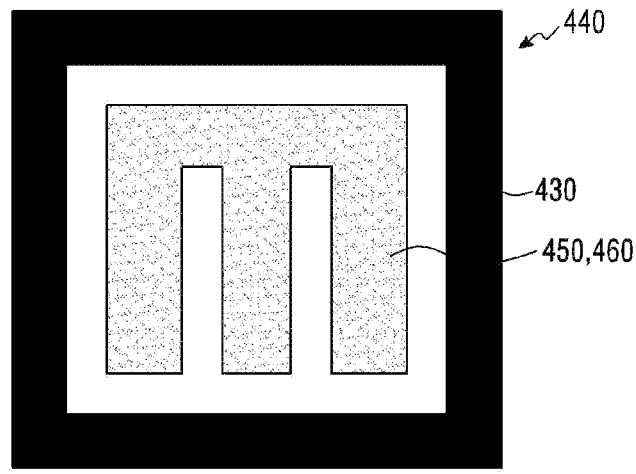
[Fig. 6d]
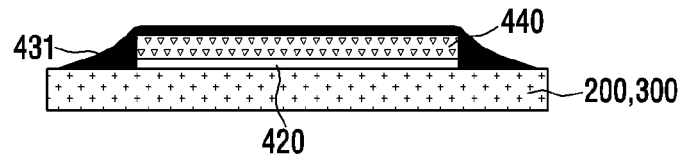
[Fig. 6e]
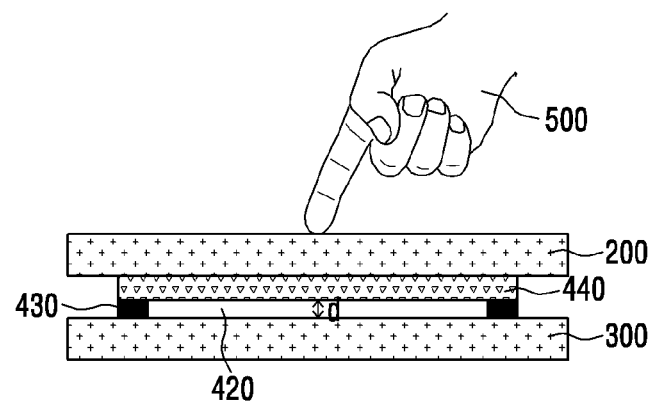

[Fig. 6f]
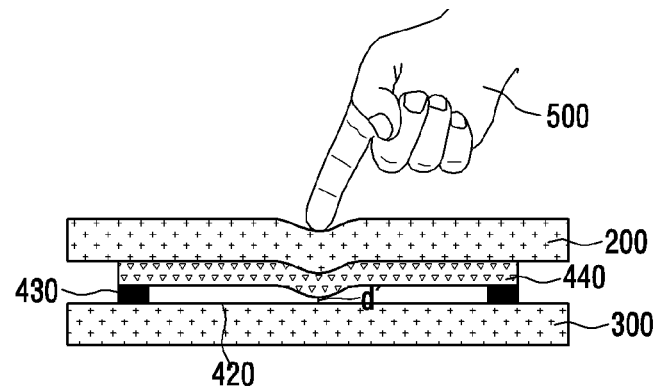
[Fig. 6g]
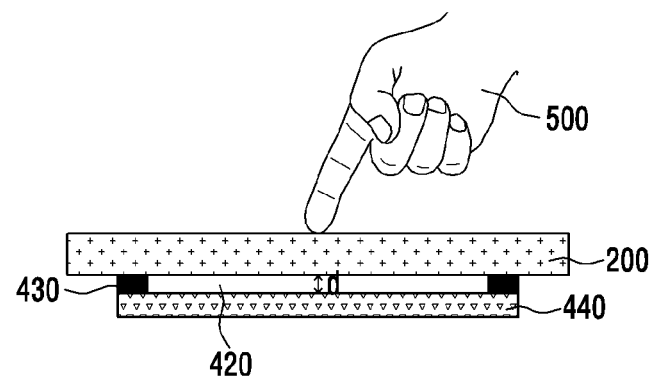
[Fig. 6h]
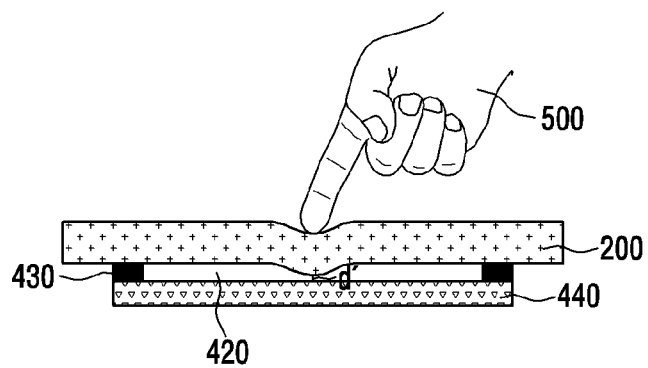

[Fig. 7a]
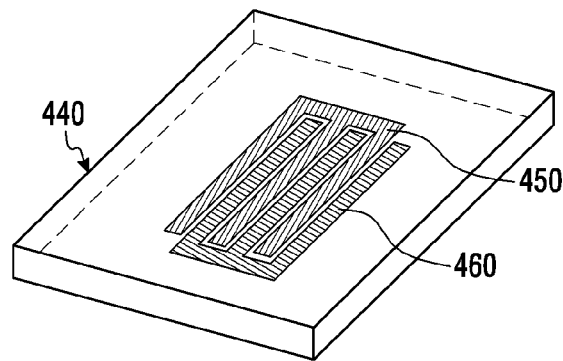
[Fig. 7b]
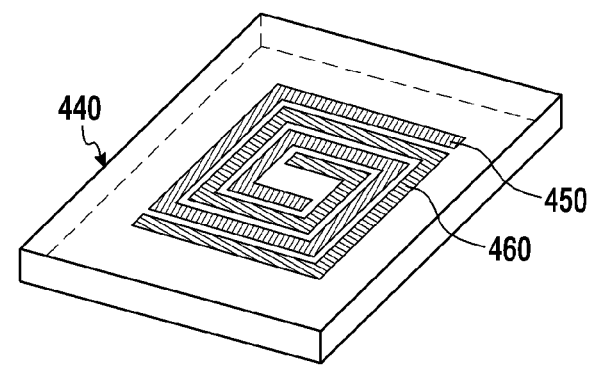
[Fig. 7c]
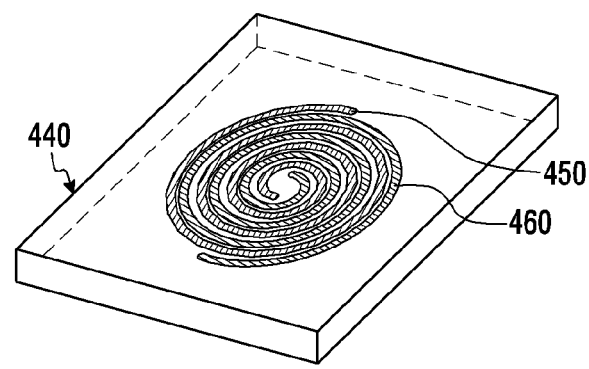

[Fig. 7d]
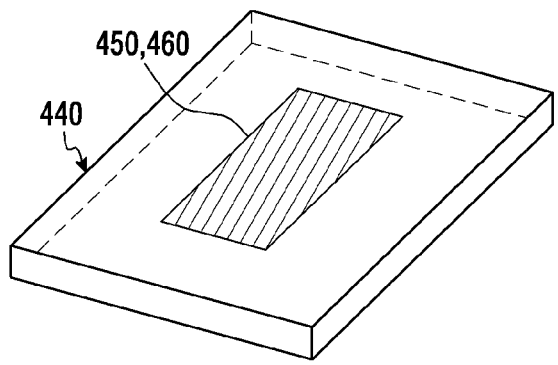
[Fig. 7e]
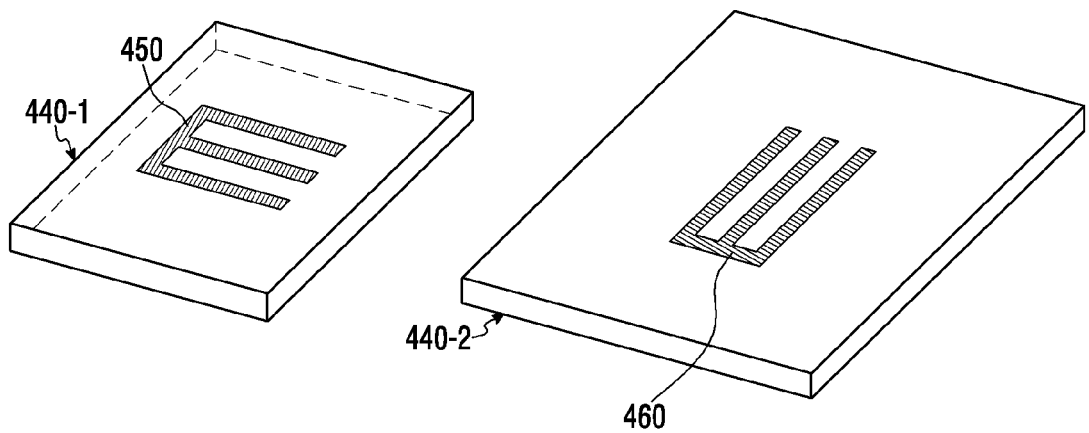
[Fig. 8a]
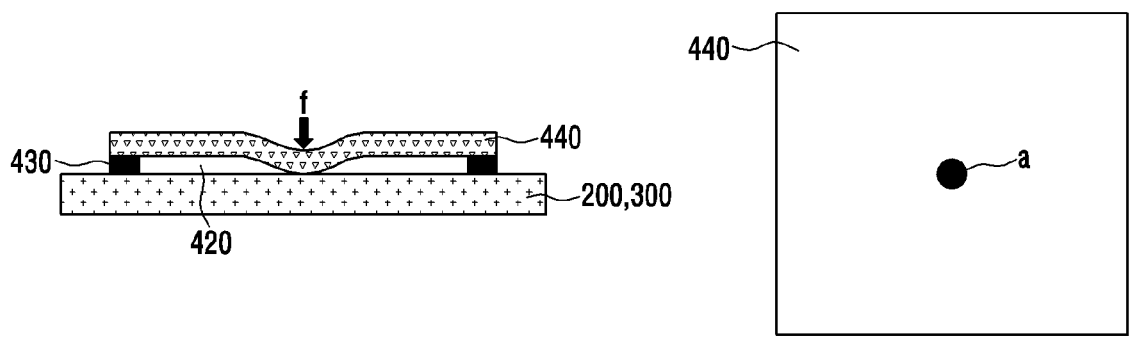

[Fig. 8b]
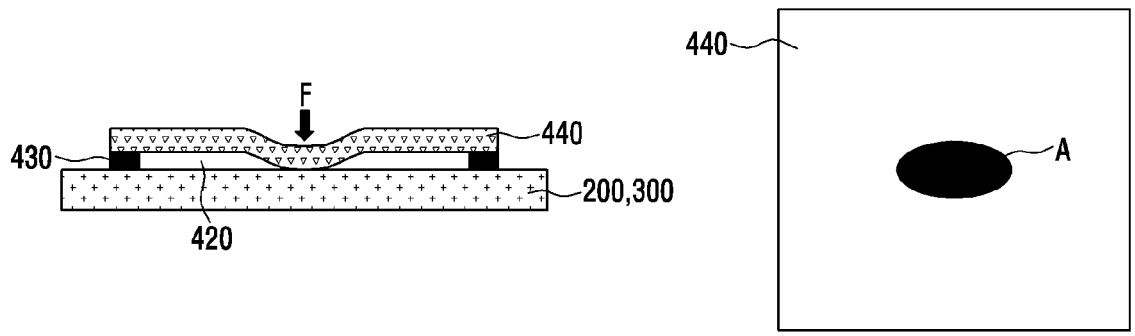
[Fig. 9]
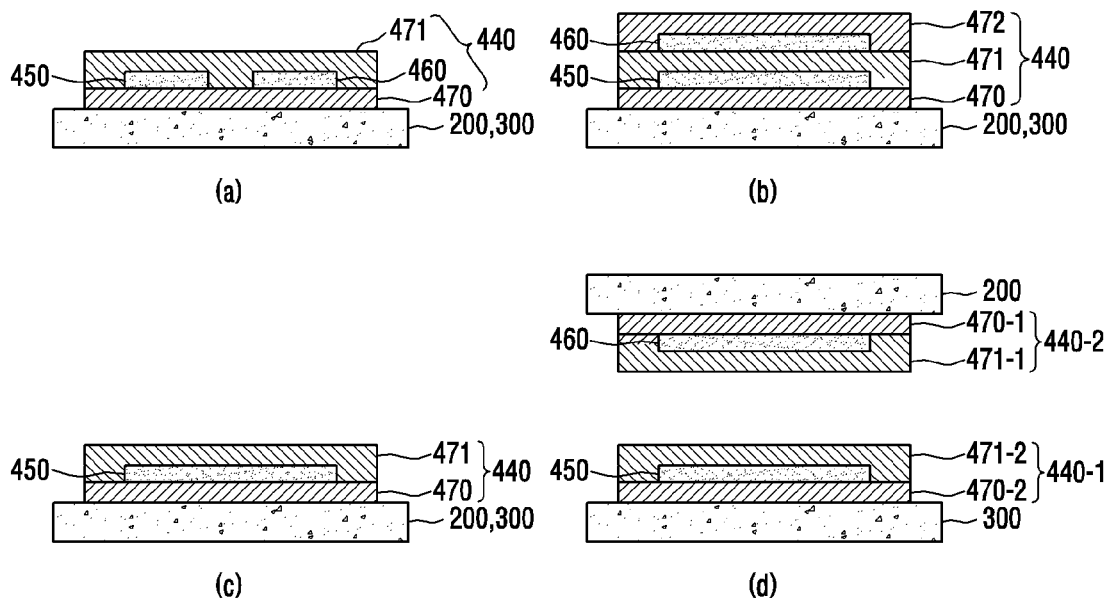
[Fig. 10a]
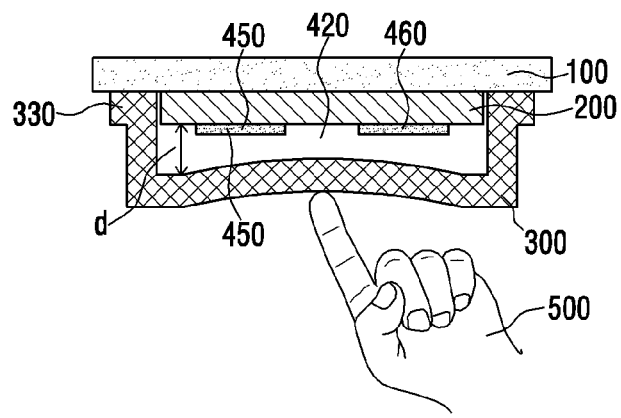

[Fig. 10b]
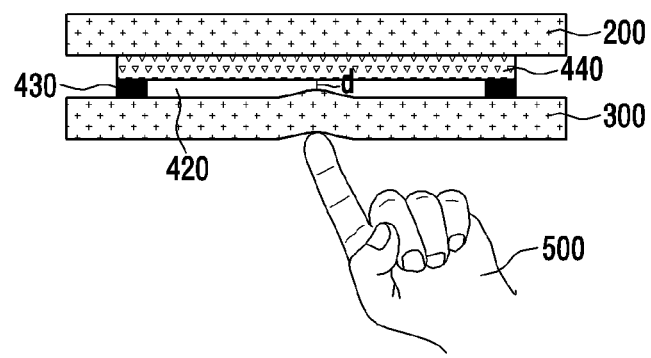
[Fig. 11a]
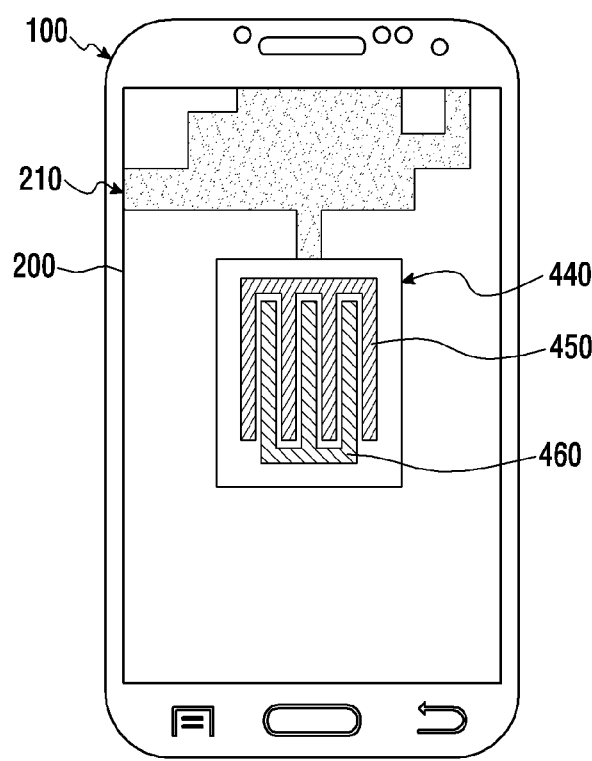

[Fig. 11b]
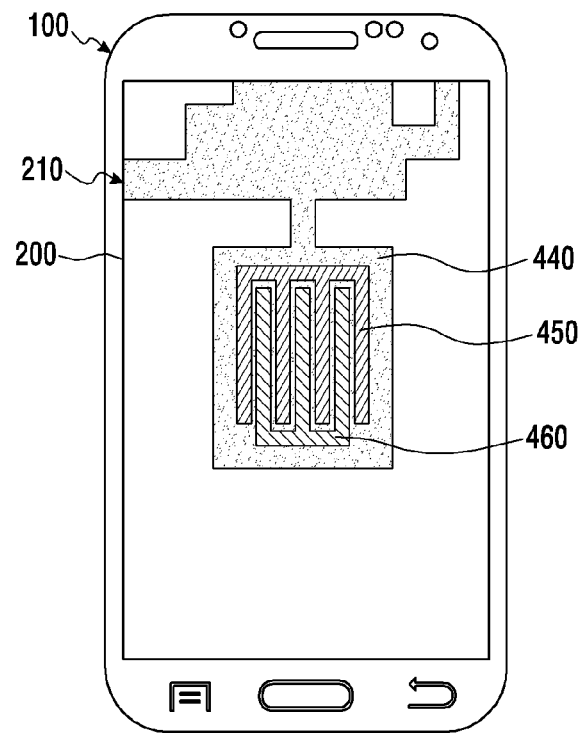
[Fig. 12a]
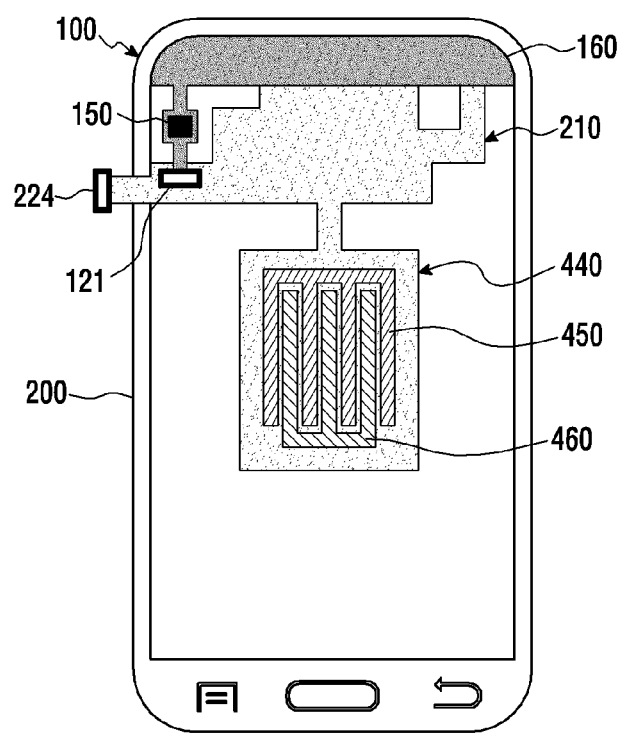

[Fig. 12b]
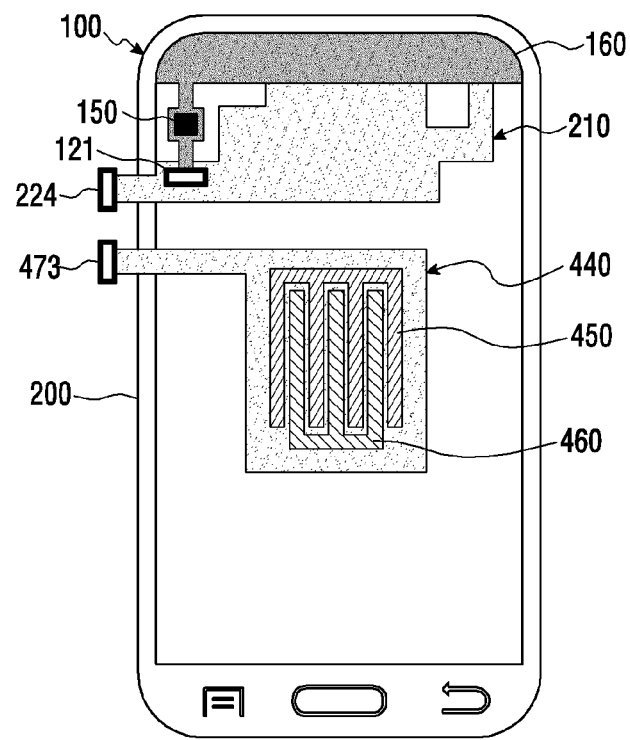
[Fig. 12c]
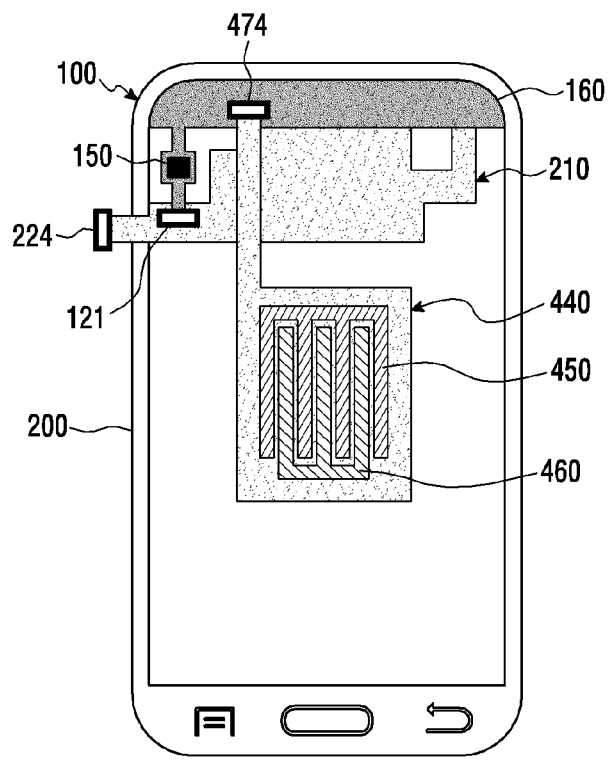

[Fig. 13a]
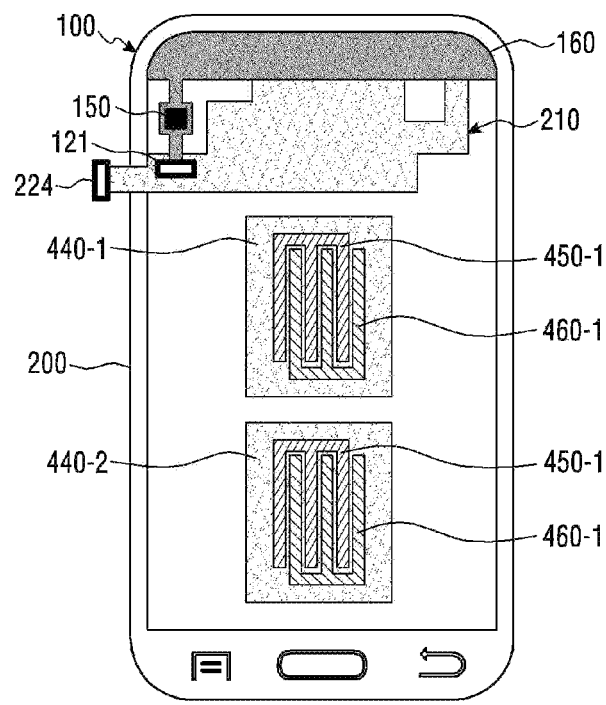
[Fig. 13b]
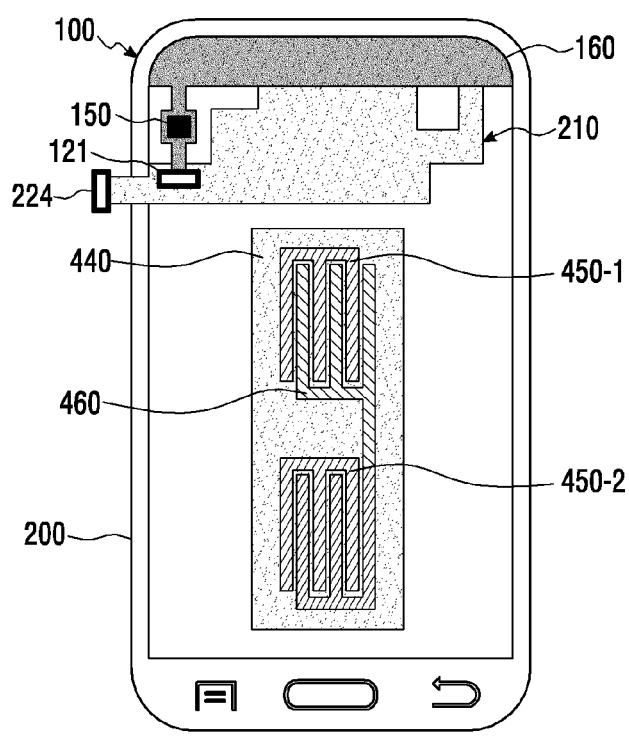

[Fig. 13c]
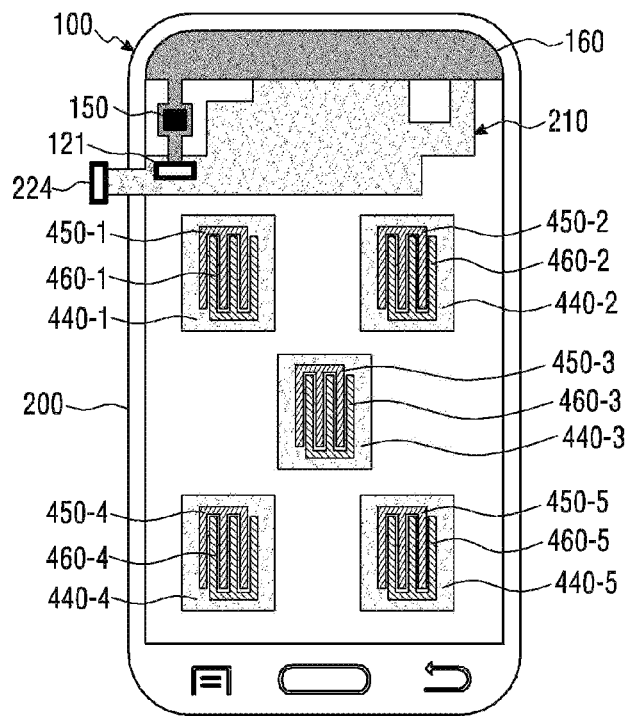
[Fig. 13d]
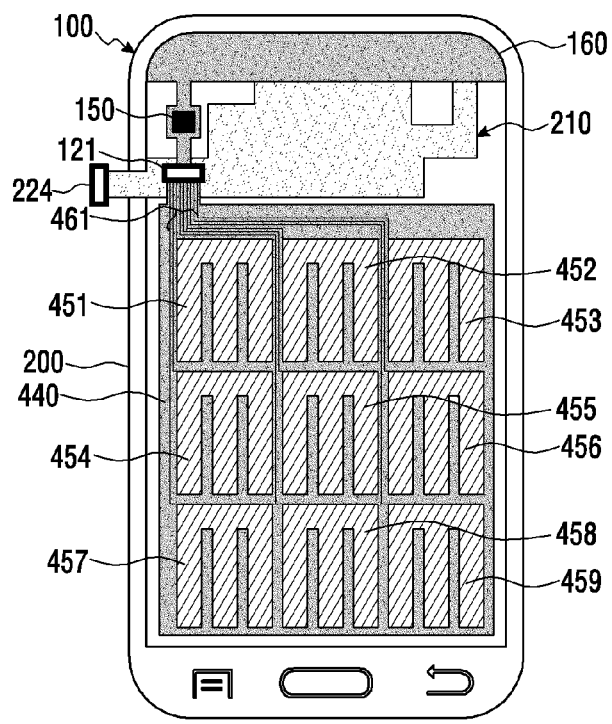

[Fig. 14a]
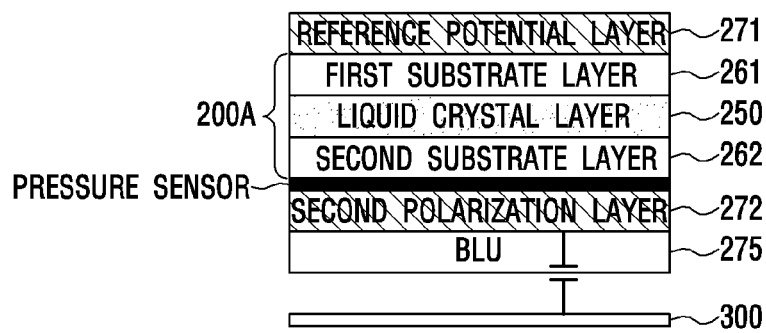
[Fig. 14b]
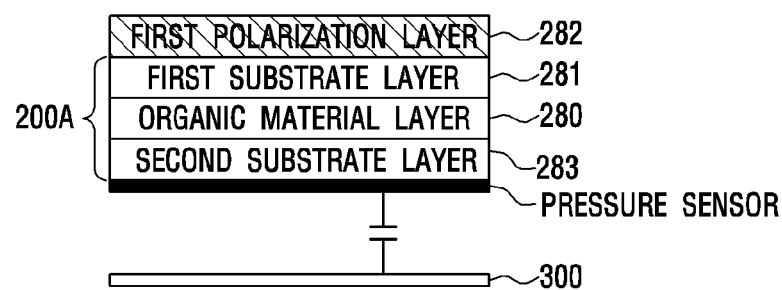
[Fig. 14c]
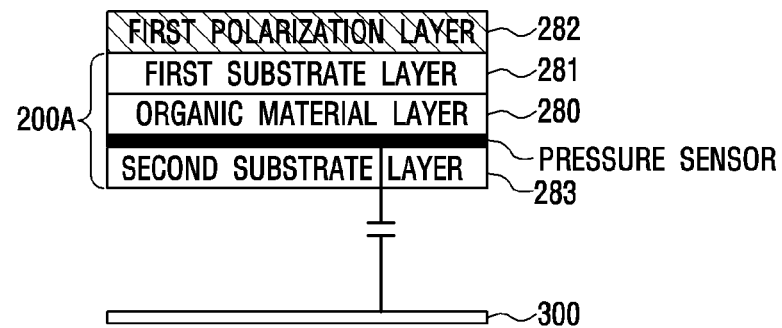

[Fig. 15a]
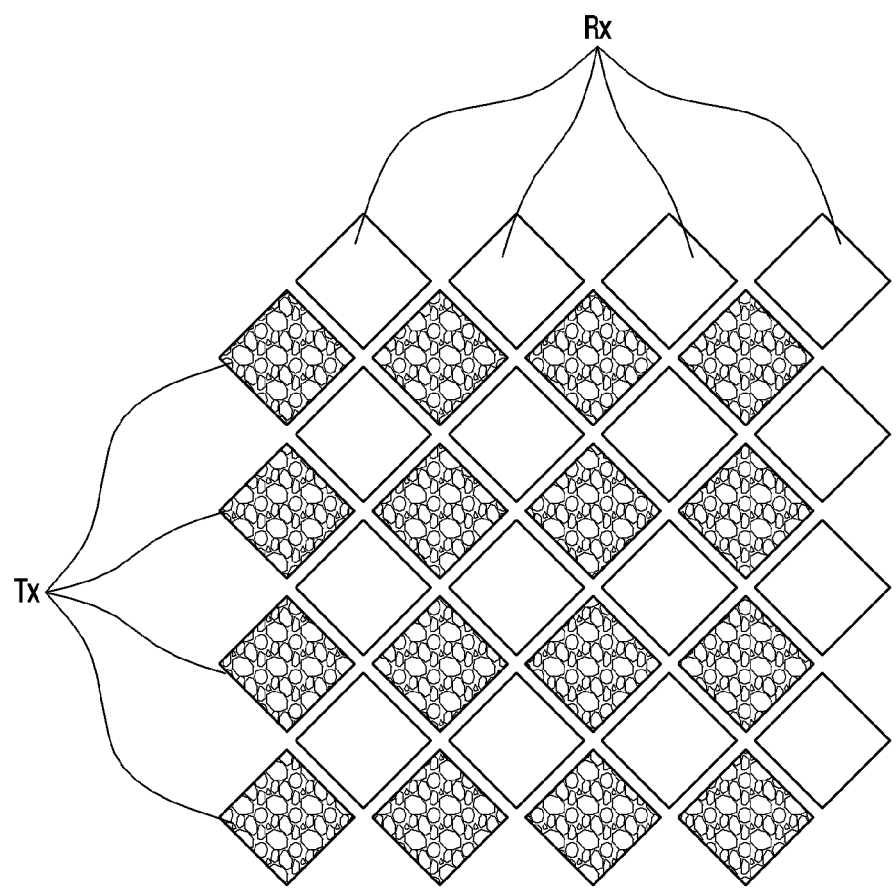

[Fig. 15b]
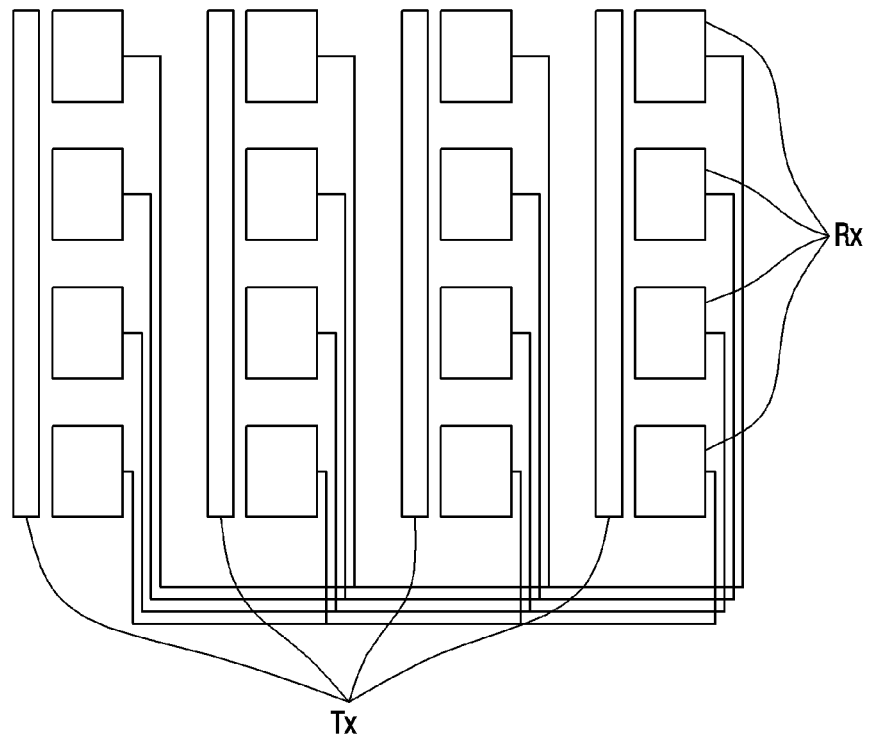
[Fig. 15c]
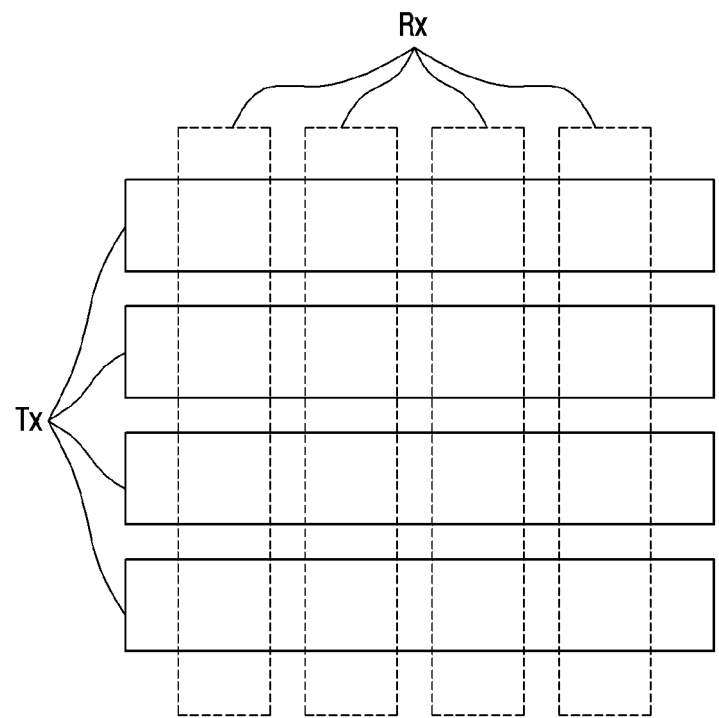

[Fig. 15d]
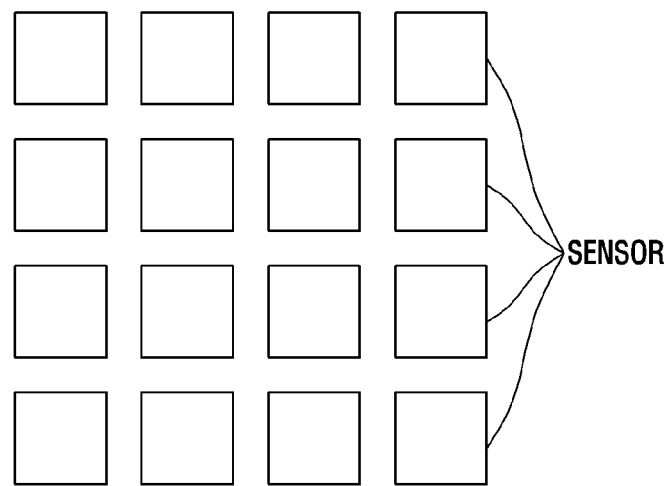

TOUCH INPUT DEVICE FOR DETECTING PRESSURE WITH DISPLAY NOISE COMPENSATION

CROSS-REFERENCE TO RELATED PATENT APPLICATIONS

The present application is a U.S. national stage application under 35 U.S.C. § 371 of PCT Application No. PCT/IB2016/057087, filed Nov. 24, 2016. The disclosure of the aforementioned priority application is incorporated herein by reference in its entirety.

TECHNICAL FIELD

The present disclosure relates to a touch input device for pressure detection and more particularly to a touch input device which is configured to detect a touch position and is capable of detecting pressure with display noise compensation.

BACKGROUND ART

Various kinds of input devices are being used to operate a computing system. For example, the input device includes a button, key, joystick and touch screen. Since the touch screen is easy and simple to operate, the touch screen is increasingly being used to operate the computing system.

The touch screen including a transparent panel with a touch-sensitive surface and a touch sensor as a touch input means can constitute a touch surface of a touch input device. The touch sensor panel is attached to the front side of a display screen, and then the touch-sensitive surface may cover the visible side of the display screen. The touch screen allows a user to operate the computing system by simply touching the touch screen by a finger, etc. Generally, the computing system recognizes the touch and a position of the touch on the touch screen and analyzes the touch, and thus, performs operations in accordance with the analysis.

Here, there is a demand for a touch input device capable of detecting not only the touch position of the touch on the touch screen but an exact pressure magnitude of the touch.

DISCLOSURE

Technical Problem

The purpose of the present invention is to provide a touch input device capable of detecting pressure with compensation for display noise change.

Technical Solution

One embodiment is a touch input device capable of detecting a pressure of a touch on a touch surface. The touch input device includes: a display panel; a substrate disposed under the display panel; and a pressure sensing unit. The pressure sensing unit includes a pressure sensor and a reference pressure sensor. When a pressure is applied to the touch surface, the display panel is bent. Electrical characteristics detected at the pressure sensor change by the bending of the display panel. A magnitude of the pressure applied to the touch surface is calculated based on a difference between a reference electrical characteristic calculated from electrical characteristics detected at the reference pressure sensor and the detected electrical characteristic calculated from the electrical characteristics detected at the pressure sensor.

Another embodiment is a touch input device capable of detecting a pressure of a touch on a touch surface. The touch input device includes: a display panel; a substrate disposed under the display panel; and a pressure sensing unit. The pressure sensing unit includes a first pressure sensor and a second pressure sensor. When a pressure is applied to the touch surface, the display panel is bent. The electrical characteristics detected in the first pressure sensor and the second pressure sensor change by the bending of the display panel. A magnitude of the pressure applied to the touch surface is calculated based on a difference between a reference electrical characteristic calculated from the electrical characteristics detected at the sensor disposed at a position relatively far from a position where the pressure is applied among the first pressure sensor and the second pressure sensor and the detected electrical characteristic calculated from the electrical characteristics detected at the sensor disposed at a position relatively close to the position where the pressure is applied among the first pressure sensor and the second pressure sensor.

Advantageous Effects

According to the embodiment of the present invention, it is possible to provide a touch input device capable of detecting pressure with compensation for display noise change.

DESCRIPTION OF DRAWINGS

FIGS. 1a and 1b are schematic views of a capacitance type touch sensor panel and the configuration for the operation of the touch sensor panel;

FIG. 2a shows a control block for controlling a touch position, touch pressure, and display operation in a touch input device according to an embodiment of the present invention;

FIGS. 2b and 2b are conceptual views showing the configuration of a display module in the touch input device;

FIG. 3a is a cross sectional view of an exemplary sensor sheet type pressure sensing unit including a pressure sensor according to the embodiment of the present invention;

FIGS. 3b and 3h to 3l are plan views of the exemplary sensor sheet type pressure sensing unit including the pressure sensor and a reference pressure sensor according to the embodiment of the present invention;

FIG. 3c is a view showing a state where the pressure sensing unit including the pressure sensor and the reference pressure sensor according to the embodiment of the present invention has been directly formed on the bottom surface of the display module, as viewed from below the display module;

FIGS. 3d to 3g are cross sectional views of the exemplary touch input device in which the pressure sensing unit including the pressure sensor and the reference pressure sensor according to the embodiment of the present invention has been disposed;

FIG. 3m is a cross sectional view of the exemplary touch input device including the pressure sensing unit and a reference pressure sensing unit according to the embodiment of the present invention;

FIGS. 4a to 4g show a first example in which a sensor sheet according to the embodiment of the present invention is applied to the touch input device;

FIGS. 5a to 5i show a second example in which the sensor sheet according to the embodiment of the present invention is applied to the touch input device;

FIGS. 6a to 6h show a third example in which the sensor sheet according to the embodiment of the present invention is applied to the touch input device;

FIGS. 7a to 7e show a pressure sensor pattern included in the sensor sheet for pressure detection according to the embodiment of the present invention;

FIGS. 8a and 8b show a relationship between the magnitude of touch pressure and a saturated area in the touch input device to which the sensor sheet according to the embodiment of the present invention is applied;

FIG. 9 shows a cross section of the sensor sheet according to the embodiment of the present invention;

FIGS. 10a and 10b show a fourth example in which the sensor sheet according to the embodiment of the present invention is applied to the touch input device;

FIGS. 11a and 11b show a method for attaching the sensor sheet according to the embodiment of the present invention;

FIGS. 12a to 12c show a method for connecting the sensor sheet according to the embodiment of the present invention to a touch sensing circuit;

FIGS. 13a to 13d show a configuration in which the sensor sheet according to the embodiment of the present invention includes a plurality of channels;

FIGS. 14a to 14c show an example in which the pressure sensing unit according to the embodiment of the present invention is directly formed in the touch input device; and FIGS. 15a to 15d show forms of a first sensor and a second sensor which are included in the sensor sheet according to the embodiment of the present invention.

MODE FOR INVENTION

The following detailed description of the present invention shows a specified embodiment of the present invention and will be provided with reference to the accompanying drawings. The embodiment will be described in enough detail that those skilled in the art are able to embody the present invention. For example, a specific shape, structure and properties, which are described in this disclosure, may be implemented in other embodiments without departing from the spirit and scope of the present invention with respect to one embodiment. Also, it should be noted that positions or placements of individual components within each disclosed embodiment may be changed without departing from the spirit and scope of the present invention. It should be understood that various embodiments of the present invention are different from each other and need not be mutually exclusive Similar reference numerals in the drawings designate the same or similar functions in many aspects.

Hereinafter, a pressure sensing unit for pressure detection according to an embodiment of the present invention and a touch input device will be described with reference to the accompanying drawings. While a capacitance type touch sensor 10 is described below, a technique of detecting a touch position in another way according to the embodiment can be applied.

FIG. 1 is a schematic view of a capacitance type touch sensor 10 included in the touch input device according to the embodiment of the present invention and the configuration for the operation thereof. Referring to FIG. 1a, the touch sensor 10 may include a plurality of drive electrodes TX1 to TXn and a plurality of receiving electrodes RX1 to RXm, and may include a drive unit 12 which applies a drive signal to the plurality of the drive electrodes TX1 to TXn for the purpose of the operation of the touch sensor 10, and a sensing unit 11 which detects the touch and the touch position by receiving a sensing signal including information on a capacitance change amount changing according to the touch on a touch surface from the plurality of receiving electrodes RX1 to RXm.

As shown in FIG. 1a, the touch sensor 10 may include the plurality of drive electrodes TX1 to TXn and the plurality of receiving electrodes RX1 to RXm. While FIG. 1a shows that the plurality of drive electrodes TX1 to TXn and the plurality of receiving electrodes RX1 to RXm of the touch sensor 10 form an orthogonal array, the present invention is not limited to this. The plurality of drive electrodes TX1 to TXn and the plurality of receiving electrodes RX1 to RXm has an array of arbitrary dimension, for example, a diagonal array, a concentric array, a 3-dimensional random array, etc., and an array obtained by the application of them. Here, "n" and "m" are positive integers and may be the same as each other or may have different values. The magnitude of the value may be changed depending on the embodiment.

As shown in FIG. 1a, the plurality of drive electrodes TX1 to TXn and the plurality of receiving electrodes RX1 to RXm may be arranged to cross each other. The drive electrode TX may include the plurality of drive electrodes TX1 to TXn extending in a first axial direction. The receiving electrode RX may include the plurality of receiving electrodes RX1 to RXm extending in a second axial direction crossing the first axial direction.

As shown in FIGS. 15a and 15b, in the touch sensor 10 according to the embodiment of the present invention, the plurality of drive electrodes TX1 to TXn and the plurality of receiving electrodes RX1 to RXm may be formed in the same layer. For example, the plurality of drive electrodes TX1 to TXn and the plurality of receiving electrodes RX1 to RXm may be formed on the same side of an insulation layer (not shown). Specifically, the plurality of drive electrodes TX1 to TXn and the plurality of receiving electrodes RX1 to RXm may be formed on the top surface of a below-described display panel 200A.

Also, as shown in FIG. 15c, the plurality of drive electrodes TX1 to TXn and the plurality of receiving electrodes RX1 to RXm may be formed in the different layers. For example, the plurality of drive electrodes TX1 to TXn and the plurality of receiving electrodes RX1 to RXm may be formed on both sides of one insulation layer (not shown) respectively, or the plurality of drive electrodes TX1 to TXn may be formed on a side of a first insulation layer (not shown) and the plurality of receiving electrodes RX1 to RXm may be formed on a side of a second insulation layer (not shown) different from the first insulation layer. Specifically, one of the plurality of drive electrodes TX1 to TXn and the plurality of receiving electrodes RX1 to RXm is formed on the top surface of the display panel 200A, and the other may be formed on the bottom surface of a cover to be described below or formed within the display panel 200A.

The plurality of drive electrodes TX1 to TXn and the plurality of receiving electrodes RX1 to RXm may be made of a transparent conductive material (for example, indium tin oxide (ITO) or antimony tin oxide (ATO) which is made of tin oxide ($SnO_2$), and indium oxide ($In_2O_3$), etc.), or the like. However, this is only an example. The drive electrode TX and the receiving electrode RX may be also made of another transparent conductive material or an opaque conductive material. For instance, the drive electrode TX and the receiving electrode RX may be formed to include at least any one of silver ink, copper, nano silver, or carbon nanotube (CNT). Also, the drive electrode TX and the receiving electrode RX may be made of metal mesh.

The drive unit 12 according to the embodiment of the present invention may apply a drive signal to the drive electrodes TX1 to TXn. In the embodiment of the present invention, one drive signal may be sequentially applied at a time to the first drive electrode TX1 to the n-th drive electrode TXn. The drive signal may be applied again repeatedly. This is only an example. The drive signal may be applied to the plurality of drive electrodes at the same time in accordance with the embodiment.

Through the receiving electrodes RX1 to RXm, the sensing unit 110 receives the sensing signal including information on a capacitance (Cm) 101 generated between the receiving electrodes RX1 to RXm and the drive electrodes TX1 to TXn to which the drive signal has been applied, thereby detecting whether or not the touch has occurred and where the touch has occurred. For example, the sensing signal may be a signal coupled by the capacitance (Cm) 101 generated between the receiving electrode RX and the drive electrode TX to which the drive signal has been applied. As such, the process of sensing the drive signal applied from the first drive electrode TX1 to the n-th drive electrode TXn through the receiving electrodes RX1 to RXm can be referred to as a process of scanning the touch sensor 10.

For example, the sensing unit 11 may include a receiver (not shown) which is connected to each of the receiving electrodes RX1 to RXm through a switch. The switch becomes the on-state in a time interval in which the signal of the corresponding receiving electrode RX is detected, thereby allowing the receiver to detect the sensing signal from the receiving electrode RX. The receiver may include an amplifier (not shown) and a feedback capacitor coupled between the negative (−) input terminal of the amplifier and the output terminal of the amplifier, i.e., coupled to a feedback path. Here, the positive (+) input terminal of the amplifier may be connected to the ground. Also, the receiver may further include a reset switch which is connected in parallel with the feedback capacitor. The reset switch may reset the conversion from current to voltage that is performed by the receiver. The negative input terminal of the amplifier is connected to the corresponding receiving electrode RX and receives and integrates a current signal including information on the capacitance (Cm) 101, and then converts the integrated current signal into voltage. The sensing unit 11 may further include an analog to digital converter (ADC) (not shown) which converts the integrated data by the receiver into digital data. Later, the digital data may be input to a processor (not shown) and processed to obtain information on the touch on the touch sensor 10. The sensing unit 11 may include the ADC and processor as well as the receiver.

A controller 13 may perform a function of controlling the operations of the drive unit 12 and the sensing unit 11. For example, the controller 13 generates and transmits a drive control signal to the drive unit 12, so that the drive signal can be applied to a predetermined drive electrode TX1 for a predetermined time period. Also, the controller 13 generates and transmits a sensing control signal to the sensing unit 11, so that the sensing unit 11 may receive the sensing signal from the predetermined receiving electrode RX for a predetermined time period and perform a predetermined function.

In FIG. 1a, the drive unit 12 and the sensing unit 11 may constitute a touch detection device (not shown) capable of detecting whether the touch has occurred on the touch sensor 10 or not and the touch position. The touch detection device may further include the controller 13. The touch detection device may be integrated and implemented on a touch sensing integrated circuit (IC) corresponding to a below-described touch sensor controller 1100 in the touch input device including the touch sensor 10. The drive electrode TX and the receiving electrode RX included in the touch sensor 10 may be connected to the drive unit 12 and the sensing unit 11 included in the touch sensing IC through, for example, a conductive trace and/or a conductive pattern printed on a circuit board, or the like. The touch sensing IC may be placed on a circuit board on which the conductive pattern has been printed, for example, a touch circuit board (hereinafter, referred to as a touch PCB). According to the embodiment, the touch sensing IC may be mounted on a main board for operation of the touch input device.

As described above, a capacitance (Cm) with a predetermined value is formed at each crossing of the drive electrode TX and the receiving electrode RX. When an object such as a finger approaches close to the touch sensor 10, the value of the capacitance may be changed. In FIG. 1a, the capacitance may represent a mutual capacitance (Cm). The sensing unit 11 detects such electrical characteristics, thereby detecting whether the touch has occurred on the touch sensor 10 or not and where the touch has occurred. For example, the sensing unit 11 is able to detect whether the touch has occurred on the surface of the touch sensor 10 comprised of a two-dimensional plane consisting of a first axis and a second axis.

More specifically, when the touch occurs on the touch sensor 10, the drive electrode TX to which the drive signal has been applied is detected, so that the position of the second axial direction of the touch can be detected. Likewise, when the touch occurs on the touch sensor 10, the capacitance change is detected from the reception signal received through the receiving electrode RX, so that the position of the first axial direction of the touch can be detected.

Up to now, although the operation mode of the touch sensor 10 sensing the touch position has been described on the basis of the mutual capacitance change amount between the drive electrode TX and the receiving electrode RX, the embodiment of the present invention is not limited to this. That is, as shown in FIG. 1b, it is also possible to detect the touch position on the basis of the change amount of a self-capacitance.

FIG. 1b is schematic views of a configuration of another capacitance type touch sensor 10 included in a touch input device according to another embodiment of the present invention and the operation of the capacitance type touch sensor. A plurality of touch electrodes 30 are provided on the touch sensor 10 shown in FIG. 1b. Although the plurality of touch electrodes 30 may be, as shown in FIG. 15d, disposed at a regular interval in the form of a grid, the present invention is not limited to this.

The drive control signal generated by the controller 13 is transmitted to the drive unit 12. On the basis of the drive control signal, the drive unit 12 applies the drive signal to the predetermined touch electrode 30 for a predetermined time period. Also, the sensing control signal generated by the controller 13 is transmitted to the sensing unit 11. On the basis of the sensing control signal, the sensing unit 11 receives the sensing signal from the predetermined touch electrode 30 for a predetermined time period. Here, the sensing signal may be a signal for the change amount of the self-capacitance formed on the touch electrode 30.

Here, whether the touch has occurred on the touch sensor 10 or not and/or the touch position are detected by the sensing signal detected by the sensing unit 11. For example, since the coordinate of the touch electrode 30 has been known in advance, whether the touch of the object on the surface of the touch sensor 10 has occurred or not and/or the touch position can be detected.

In the foregoing, for convenience of description, it has been described that the drive unit 12 and the sensing unit 11 operate individually as a separate block. However, the operation to apply the drive signal to the touch electrode 30 and to receive the sensing signal from the touch electrode 30 can be also performed by one drive and sensing unit.

The foregoing has described in detail the capacitance type touch sensor as the touch sensor 10. However, in the touch input device 1000 according to the embodiment of the present invention, the touch sensor 10 for detecting whether or not the touch has occurred and the touch position may be implemented by using not only the above-described method but also any touch sensing method such as a surface capacitance type method, a projected capacitance type method, a resistance film method, a surface acoustic wave (SAW) method, an infrared method, an optical imaging method, a dispersive signal technology, and an acoustic pulse recognition method, etc.

FIG. 2a shows a control block for controlling the touch position, a touch pressure and a display operation in the touch input device according to the embodiment of the present invention. In the touch input device 1000 configured to detect the touch pressure in addition to the display function and touch position detection, the control block may include the above-described touch sensor controller 1100 for detecting the touch position, a display controller 1200 for driving the display panel, and a pressure sensor controller 1300 for detecting the pressure. The display controller 1200 may include a control circuit which receives an input from an application processor (AP) or a central processing unit (CPU) on a mainboard for the operation of the touch input device 1000 and displays the favorite contents on the display panel 200A. The control circuit may be mounted on a display circuit board (hereafter, referred to as a display PCB). The control circuit may include a display panel control IC, a graphic controller IC, and a circuit required to operate other display panel 200A.

The pressure sensor controller 1300 for detecting the pressure through the pressure sensing unit may be configured similarly to the touch sensor controller 1100, and thus, may operate similarly to the touch sensor controller 1100. Specifically, as shown in FIGS. 1a and 1b, the pressure sensor controller 1300 may include the drive unit, the sensing unit, and the controller, and may detect a magnitude of the pressure by the sensing signal sensed by the sensing unit. Here, the pressure sensor controller 1300 may be mounted on the touch PCB on which the touch sensor controller 1100 has been mounted or may be mounted on the display PCB on which the display controller 1200 has been mounted.

According to the embodiment, the touch sensor controller 1100, the display controller 1200, and the pressure sensor controller 1300 may be included as different components in the touch input device 1000. For example, the touch sensor controller 1100, the display controller 1200, and the pressure sensor controller 1300 may be composed of different chips respectively. Here, a processor 1500 of the touch input device 1000 may function as a host processor for the touch sensor controller 1100, the display controller 1200, and the pressure sensor controller 1300.

The touch input device 1000 according to the embodiment of the present invention may include an electronic device including a display screen and/or a touch screen, such as a cell phone, a personal data assistant (PDA), a smartphone, a tablet personal computer (PC).

In order to manufacture such a slim and lightweight light-weighing touch input device 1000, the touch sensor controller 1100, the display controller 1200, and the pressure sensor controller 1300, which are, as described above, formed separately from each other, may be integrated into one or more configurations in accordance with the embodiment of the present invention. In addition to this, these controllers can be integrated into the processor 1500 respectively. Also, according to the embodiment of the present invention, the touch sensor 10 and/or the pressure sensing unit may be integrated into the display panel 200A.

In the touch input device 1000 according to the embodiment of the present invention, the touch sensor 10 for detecting the touch position may be positioned outside or inside the display panel. The display panel of the touch input device 1000 according to the embodiment of the present invention may be a display panel included in a liquid crystal display (LCD), a plasma display panel (PDP), an organic light emitting diode (OLED), etc.

FIGS. 2b and 2b are conceptual views for describing the configuration of a display module 200 in the touch input device 1000 according to the embodiment of the present invention.

First, the configuration of the display module 200 including the display panel 200A using an LCD panel will be described with reference to FIG. 2b.

As shown in FIG. 2b, the display module 200 may include the display panel 200A that is an LCD panel, a first polarization layer 271 disposed on the display panel 200A, and a second polarization layer 272 disposed under the display panel 200A. The display panel 200A that is an LCD panel may include a liquid crystal layer 250 including a liquid crystal cell, a first substrate layer 261 disposed on the liquid crystal layer 250, and a second substrate layer 262 disposed under the liquid crystal layer 250. Here, the first substrate layer 261 may be made of color filter glass, and the second substrate layer 262 may be made of TFT glass. Also, according to the embodiment, at least one of the first substrate layer 261 and the second substrate layer 262 may be made of a bendable material such as plastic. In FIG. 2b, the second substrate layer 262 may be comprised of various layers including a data line, a gate line, TFT, a common electrode, and a pixel electrode, etc. These electrical components may operate in such a manner as to generate a controlled electric field and orient liquid crystals located in the liquid crystal layer 250.

Next, the configuration of the display module 200 including the display panel 200A using an OLED panel will be described with reference to FIG. 2c.

As shown in FIG. 2c, the display module 200 may include the display panel 200A that is an OLED panel, and a first polarization layer 282 disposed on the display panel 200A. The display panel 200A that is an OLED panel may include an organic material layer 280 including an organic light-emitting diode (OLED), a first substrate layer 281 disposed on the organic material layer 280, and a second substrate layer 283 disposed under the organic material layer 280. Here, the first substrate layer 281 may be made of encapsulation glass, and the second substrate layer 283 may be made of TFT glass. Also, according to the embodiment, at least one of the first substrate layer 281 and the second substrate layer 283 may be made of a bendable material such as plastic. The OLED panel shown in FIGS. 3d to 3f may include an electrode used to drive the display panel 200A, such as a gate line, a data line, a first power line (ELVDD), a second power line (ELVSS), etc. The organic light-emitting diode (OLED) panel is a self-light emitting display panel which uses a principle where, when current flows through a fluorescent or phosphorescent organic thin film and then electrons and electron holes are combined in the organic material layer, so that light is generated. The organic material constituting the light emitting layer determines the color of the light.

Specifically, the OLED uses a principle in which when electricity flows and an organic matter is applied on glass or plastic, the organic matter emits light. That is, the principle is that electron holes and electrons are injected into the anode and cathode of the organic matter respectively and are recombined in the light emitting layer, so that a high energy exciton is generated and the exciton releases the energy while falling down to a low energy state and then light with a particular wavelength is generated. Here, the color of the light is changed according to the organic matter of the light emitting layer.

The OLED includes a line-driven passive-matrix organic light-emitting diode (PM-OLED) and an individual driven active-matrix organic light-emitting diode (AM-OLED) in accordance with the operating characteristics of a pixel constituting a pixel matrix. None of them require a backlight. Therefore, the OLED enables a very thin display module to be implemented, has a constant contrast ratio according to an angle and obtains a good color reproductivity depending on a temperature. Also, it is very economical in that non-driven pixel does not consume power.

In terms of operation, the PM-OLED emits light only during a scanning time at a high current, and the AM-OLED maintains a light emitting state only during a frame time at a low current. Therefore, the AM-OLED has a resolution higher than that of the PM-OLED and is advantageous for driving a large area display panel and consumes low power. Also, a thin film transistor (TFT) is embedded in the AM-OLED, and thus, each component can be individually controlled, so that it is easy to implement a delicate screen.

Also, the organic material layer 280 may include a HIL (Hole Injection Layer), a HTL (Hole Transfer Layer), an EIL (Electron Injection Layer), an ETL (Electron Transfer Layer), and an EML (Emission Material Layer, or light-emitting layer).

Briefly describing each of the layers, HIL injects electron holes and is made of a material such as CuPc, etc. HTL functions to move the injected electron holes and mainly is made of a material having a good hole mobility. Arylamine, TPD, and the like may be used as the HTL. The EIL and ETL inject and transport electrons. The injected electrons and electron holes are combined in the EML and emit light. The EML represents the color of the emitted light and is composed of a host determining the lifespan of the organic matter and an impurity (dopant) determining the color sense and efficiency. This just describes the basic structure of the organic material layer 280 include in the OLED panel. The present invention is not limited to the layer structure or material, etc., of the organic material layer 280.

The organic material layer 280 is inserted between an anode (not shown) and a cathode (not shown). When the TFT becomes an on-state, a driving current is applied to the anode and the electron holes are injected, and the electrons are injected to the cathode. Then, the electron holes and electrons move to the organic material layer 280 and emit the light.

It will be apparent to a skilled person in the art that the LCD panel or the OLED panel may further include other structures so as to perform the display function and may be deformed.

The display module 200 of the touch input device 1000 according to the embodiment of the present invention may include the display panel 200A and a configuration for driving the display panel 200A. Specifically, when the display panel 200A is an LCD panel, the display module 200 may include a backlight unit (not shown) disposed under the second polarization layer 272 and may further include a display panel control IC for operation of the LCD panel, a graphic control IC, and other circuits.

In the touch input device 1000 according to the embodiment of the present invention, the touch sensor 10 for detecting the touch position may be positioned outside or inside the display module 200.

When the touch sensor 10 in the touch input device 1000 positioned outside the display module 200, the touch sensor panel may be disposed on the display module 200, and the touch sensor 10 may be included in the touch sensor panel. The touch surface of the touch input device 1000 may be the surface of the touch sensor panel.

When the touch sensor 10 in the touch input device 1000 positioned inside the display module 200, the touch sensor 10 may be configured to be positioned outside the display panel 200A. Specifically, the touch sensor 10 may be formed on the top surfaces of the first substrate layers 261 and 281. Here, the touch surface of the touch input device 1000 may be an outer surface of the display module 200 and may be the top surface or bottom surface in FIGS. 2b and 2c.

When the touch sensor 10 in the touch input device 1000 positioned inside the display module 200, at least a portion of the touch sensor 10 may be configured to be positioned inside the display panel 200A, and at least a portion of the remaining touch sensor 10 may be configured to be positioned outside the display panel 200A. For example, any one of the drive electrode TX and the receiving electrode RX, which constitute the touch sensor 10, may be configured to be positioned outside the display panel 200A, and the other may be configured to be positioned inside the display panel 200A. Specifically, any one of the drive electrode TX and the receiving electrode RX, which constitute the touch sensor 10, may be formed on the top surface of the top surfaces of the first substrate layers 261 and 281, and the other may be formed on the bottom surfaces of the first substrate layers 261 and 281 or may be formed on the top surfaces of the second substrate layers 262 and 283.

When the touch sensor 10 in the touch input device 1000 positioned inside the display module 200, the touch sensor 10 may be configured to be positioned inside the display panel 200A. Specifically, the touch sensor 10 may be formed on the bottom surfaces of the first substrate layers 261 and 281 or may be formed on the top surfaces of the second substrate layers 262 and 283.

When the touch sensor 10 is positioned inside the display panel 200A, an electrode for operation of the touch sensor may be additionally disposed. However, various configurations and/or electrodes positioned inside the display panel 200A may be used as the touch sensor 10 for sensing the touch. Specifically, when the display panel 200A is the LCD panel, at least any one of the electrodes included in the touch sensor 10 may include at least any one of a data line, a gate line, TFT, a common electrode (Vcom), and a pixel electrode. When the display panel 200A is the OLED panel, at least any one of the electrodes included in the touch sensor

10 may include at least any one of a data line, a gate line, a first power line (ELVDD), and a second power line (ELVSS).

Here, the touch sensor 10 may function as the drive electrode and the receiving electrode described in FIG. 1*a* and may detect the touch position in accordance with the mutual capacitance between the drive electrode and the receiving electrode. Also, the touch sensor 10 may function as the single electrode 30 described in FIG. 1*b* and may detect the touch position in accordance with the self-capacitance of each of the single electrodes 30. Here, if the electrode included in the touch sensor 10 is used to drive the display panel 200A, the touch sensor 10 may drive the display panel 200A in a first time interval and may detect the touch position in a second time interval different from the first time interval.

The foregoing has described the display module 200 included in the touch input device 1000. Hereinafter, described in detail is an example of a case of detecting touch pressure by applying the pressure sensing unit according to the embodiment of the present invention to the touch input device 1000.

The pressure sensing unit according to the embodiment of the present invention may be formed in the form of a sensor sheet and may be attached to the touch input device 1000 including the display module 200 and a substrate 300.

FIG. 3*a* is a cross sectional view of an exemplary sensor sheet type pressure sensing unit including a pressure sensor according to the embodiment of the present invention. For example, the sensor sheet 440 may include a sensor layer between a first insulation layer 470 and a second insulation layer 471. The sensor layer may include a first sensor 450 and/or a second sensor 460. Here, the first insulation layer 470 and the second insulation layer 471 may be made of an insulating material such as a polyimide. The first sensor 450 and the second sensor 460 which are included in the sensor layer may include a material like copper. In accordance with the manufacturing process of the sensor sheet 440, the sensor layer and the second insulation layer 471 may be adhered to each other by means of an adhesive (not shown) like an optically clear adhesive (OCA). Also, according to the embodiment, the pressure sensors 450 and 460 may be formed by positioning a mask, which has a through-hole corresponding to a pressure sensor pattern, on the first insulation layer 470, and then by spraying a conductive material.

FIGS. 4*a* to 4*g* show a first example in which the sensor sheet type pressure sensing unit according to the embodiment of the present invention is applied to the touch input device.

In the touch input device 1000 according to the first example of the present invention, lamination may occur by an adhesive like the optically clear adhesive (OCA) between a cover layer 100 and the display module 200, where the touch sensor for detecting the touch position is formed. As a result, the display color clarity, visibility and optical transmittance of the display module 200, which can be recognized through the touch surface of the touch sensor, can be improved.

In the description with reference to FIGS. 4*a* to 4*g*, it is shown that as the touch input device 1000 according to the first example of the present invention, the cover layer 100 in which the touch sensor has been formed is laminated on and attached to the display module 200 by means of an adhesive. However, the touch input device 1000 according to the first example of the present invention may include that the touch sensor is disposed within the display module 200 shown in FIGS. 2*b*, 2*c*, etc. More specifically, while FIGS. 4*a* to 4*b* show that the cover layer 100 where the touch sensor 10 has been formed covers the display module 200, the touch input device 1000 which includes the touch sensor 10 disposed inside the display module 200 and includes the display module 200 covered with the cover layer 100 like glass may be used as the first example of the present invention.

The touch input device 1000 to which the sensor sheet type pressure sensing unit can be applied according to the embodiment of the present invention may include an electronic device including the touch screen, for example, a cell phone, a personal data assistant (PDA), a smart phone, a tablet personal computer, an MP3 player, a laptop computer, etc.

In the touch input device 1000 to which the sensor sheet type pressure sensing unit can be applied according to the embodiment of the present invention, the substrate 300, together with an outermost housing 320 of the touch input device 1000, may function to surround a mounting space 310, etc., where the circuit board and/or battery for operation of the touch input device 1000 are placed. Here, the circuit board for operation of the touch input device 1000 may be a mainboard. A central processing unit (CPU), an application processor (AP) or the like may be mounted on the circuit board. Due to the substrate 300, the display module 200 is separated from the circuit board and/or battery for operation of the touch input device 1000. Due to the substrate 300, electrical noise generated from the display module 200 and noise generated from the circuit board can be blocked. The touch sensor 10 or the cover layer 100 of the touch input device 1000 may be formed wider than the display module 200, the substrate 300, and the mounting space 310. As a result, the housing 320 may be formed such that the housing 320, together with the cover layer 100, surrounds the display module 200, the substrate 300, and the circuit board.

The touch input device 1000 according to the first example of the present invention can detect the touch position through the touch sensor 10 and can detect the touch pressure by disposing the sensor sheet 440 between the display module 200 and the substrate 300. Here, the touch sensor 10 may be disposed inside or outside the display module 200.

Hereinafter, the components which include the sensor sheet 440 and are for detecting the pressure are collectively referred to as a pressure detection module 400. For example, the pressure detection module 400 in the first example may include the sensor sheet 440 and/or a spacer layer 420.

The pressure detection module 400 may include, for example, the spacer layer 420 composed of an air gap. This will be described in detail with reference to FIGS. 4*b* to 4*g*.

According to the embodiment, the spacer layer 420 may be implemented with the air gap. According to the embodiment, the spacer layer 420 may be made of an impact absorbing material. According to the embodiment, the spacer layer 420 may be filled with a dielectric material.

According to the embodiment, the spacer layer 420 may be made of a material having a restoring force by which the material contracts by applying the pressure and returns to its original shape by releasing the pressure. According to the embodiment, the spacer layer 420 may be made of elastic foam. Also, since the spacer layer is disposed under the display module 200, the spacer layer may be made of a transparent material or an opaque material.

FIG. 4*b* is a perspective view of the touch input device 1000 according to the first example of the present invention. As shown in FIG. 4*b*, in the first example of the present invention, the sensor sheet 440 may be disposed between the display module 200 and the substrate 300 in the touch input device 1000. Here, in order to dispose the sensor sheet 440, the spacer layer which leaves a space between the display module 200 and the substrate 300 of the touch input device 1000 may be included.

Hereinafter, for the purpose of clearly distinguishing the sensors 450 and 460 from the electrode included in the touch sensor 10, the sensors 450 and 460 which are included in the pressure sensing unit and detect the pressure are designated as pressure sensors 450 and 460. Here, since the pressure sensors 450 and 460 are disposed on the rear side instead of in the front side of the display panel 200A, the pressure sensors 450 and 460 may be made of an opaque material as well as a transparent material. When the display panel 200A is an LCD panel, the pressure sensors 450 and 460 can be composed of a transparent material such as ITO.

Here, a frame 330 having a predetermined thickness may be formed along the border of the upper portion of the substrate 300 in order to maintain the spacer layer 420 in which the sensor sheet 440 is disposed. Here, the frame 330 may be bonded to the cover layer 100 by means of an adhesive tape (not shown). While FIG. 4b shows the frame 330 is formed at the entire border (e.g., four sides of the quadrangle) of the substrate 300, the frame 330 may be formed only on at least some (e.g., three sides of the quadrangle) of the border of the substrate 300. According to the embodiment, the frame 330 may be formed on the top surface of the substrate 300 and may be integrally formed with the substrate 300. In the embodiment of the present invention, the frame 330 may be made of an inelastic material. In the embodiment of the present invention, when pressure is applied to the display module 200 through the cover layer 100, the display module 200 may be bent. Therefore, the magnitude of the touch pressure can be detected even though the frame 330 is not transformed by the pressure.

FIG. 4c is a cross sectional view of the touch input device including the pressure sensor of the sensor sheet according to the embodiment of the present invention. While FIG. 4c and some of the following figures show that the pressure sensors 450 and 460 are separated from the sensor sheet 440, this is only for convenience of description. The pressure sensors 450 and 460 may be included in the sensor sheet 440. As shown in FIG. 4c, the sensor sheet 440 including the pressure sensors 450 and 460 according to the embodiment of the present invention may be disposed within the spacer layer 420 and on the substrate 300.

The pressure sensor for detecting the pressure may include the first sensor 450 and the second sensor 460. Here, any one of the first and the second sensors 450 and 460 may be a drive sensor and the other may be a receiving sensor. A drive signal is applied to the drive sensor, and a sensing signal including information on electrical characteristics changing by applying the pressure may be obtained through the receiving sensor. When voltage is applied, the mutual capacitance may be generated between the first sensor 450 and the second sensor 460.

FIG. 4d is a cross sectional view when pressure is applied to the touch input device 1000 shown in FIG. 4c. The bottom surface of the display module 200 may have a ground potential so as to block the noise. When the pressure is applied to the surface of the cover layer 100 by an object 500, the cover layer 100 and the display module 200 may be bent or pressed. As a result, a distance "d" between the ground potential surface and the pressure sensors 450 and 460 may be decreased to "d'". In this case, due to the decrease of the distance "d", the fringing capacitance is absorbed in the bottom surface of the display module 200, so that the mutual capacitance between the first sensor 450 and the second sensor 460 may be reduced. Therefore, the magnitude of the touch pressure can be calculated by obtaining the reduction amount of the mutual capacitance from the sensing signal obtained through the receiving sensor.

Although it has been described in FIG. 4d that the bottom surface of the display module 200 has a ground potential, that is to say, is a reference potential layer, the reference potential layer may be disposed within the display module 200. Here, when pressure is applied to the surface of the cover layer 100 by the object 500, the cover layer 100 and the display module 200 may be bent or pressed. As a result, a distance between the pressure sensors 450 and 460 and the reference potential layer disposed within the display module 200 is changed. Therefore, the magnitude of the touch pressure can be calculated by obtaining the capacitance change amount from the sensing signal obtained through the receiving sensor.

In the touch input device 1000 to which the sensor sheet 440 is applied according to the embodiment of the present invention, the display module 200 may be bent or pressed by the touch pressure. The display module 200 may be bent or pressed in such a manner as to show the transformation caused by the touch. When the display module 200 is bent or pressed according to the embodiment, a position showing the biggest transformation may not match the touch position. However, the display module 200 may be shown to be bent at least at the touch position. For example, when the touch position approaches close to the border, edge, etc., of the display module 200, the most bent or pressed position of the display module 200 may not match the touch position, however, the display module 200 may be shown to be bent or pressed at least at the touch position.

Here, the top surface of the substrate 300 may also have the ground potential in order to block the noise. FIG. 9 shows a cross section of the sensor sheet according to the embodiment of the present invention. Referring to (a) of FIG. 9, a cross section when the sensor sheet 440 including the pressure sensors 450 and 460 is attached to the substrate 300 or the display module 200 is shown in (a) of FIG. 9. Here, in the sensor sheet 440, since the pressure sensors 450 and 460 are disposed between the first insulation layer 470 and the second insulation layer 471, a short-circuit can be prevented from occurring between the pressure sensors 450 and 460 and either the substrate 300 or the display module 200. Also, depending on the kind and/or implementation method of the touch input device 1000, the substrate 300 or the display module 200 on which the pressure sensors 450 and 460 are attached may not have the ground potential or may have a weak ground potential. In this case, the touch input device 1000 according to the embodiment of the present may further include a ground electrode (not shown) between the first insulation layer 470 and either the substrate 300 or the display module 200. According to the embodiment, another insulation layer (not shown) may be included between the ground electrode and either the substrate 300 or the display module 200. Here, the ground electrode (not shown) is able to prevent the size of the capacitance generated between the first sensor 450 and the second sensor 460, which are pressure sensors, from increasing excessively.

FIG. 4e shows that the sensor sheet 440 including the pressure sensors 450 and 460 according to the embodiment of the present invention is formed on the bottom surface of the display module 200. Here, the substrate 300 may have the ground potential. Therefore, a distance "d" between the substrate 300 and the pressure sensors 450 and 460 is reduced by touching the touch surface of the cover layer 100. Consequently, this may cause the change of the mutual capacitance between the first sensor 450 and the second sensor 460.

FIG. 7 shows the pattern of the pressure sensor included in the pressure sensing unit for detecting the pressure in accordance with the embodiment of the present invention. FIGS. 7a to 7c show the patterns of the first sensor 450 and the second sensor 460 included in the pressure sensing unit 440. The pressure sensing unit 440 including the pattern of the pressure sensor shown in FIGS. 7a to 7c may be formed on the substrate 300 or on the bottom surface of the display module 200. The capacitance between the first sensor 450 and the second sensor 460 may be changed depending on a distance between the reference potential layer (display module 200 or substrate 300) and the sensor layer including both the first sensor 450 and the second sensor 460.

When the magnitude of the touch pressure is detected as the mutual capacitance between the first sensor 450 and the second sensor 460 is changed, it is necessary to form the patterns of the first sensor 450 and the second sensor 460 so as to generate the range of the capacitance required to improve the detection accuracy. With the increase of a facing area or facing length of the first sensor 450 and the second sensor 460, the size of the capacitance that is generated may become larger. Therefore, the pattern can be designed by adjusting the size of the facing area, facing length and facing shape of the first sensor 450 and the second sensor 460 in accordance with the range of the necessary capacitance. FIGS. 7b and 7c show that the first sensor 450 and the second sensor 460 are formed in the same layer, and show that the pressure sensor is formed such that the facing length of the first sensor 450 and the second sensor 460 becomes relatively longer.

As such, in the state where the first sensor 450 and the second sensor 460 are formed in the same layer, each of the first sensor 450 and the second sensor 460 shown in (a) of FIG. 9 may be, as shown in FIG. 15a, composed of a plurality of lozenge-shaped sensors. Here, the plurality of the first sensors 450 are connected to each other in a first axial direction, and the plurality of the second sensors 460 are connected to each other in a second axial direction orthogonal to the first axial direction. The lozenge-shaped sensors of at least one of the first and the second sensors 450 and 460 are connected to each other through a bridge, so that the first sensor 450 and the second sensor 460 may be insulated from each other. Also, here, the first sensor 450 and the second sensor 460 shown in (a) of FIG. 9 may be composed of a sensor having a form shown in FIG. 15b.

It can be considered that the first sensor 450 and the second sensor 460 are formed in different layers in accordance with the embodiment and form the sensor layer. A cross section when the first sensor 450 and the second sensor 460 are formed in different layers is shown in (b) of FIG. 9. As shown in (b) of FIG. 9, the first sensor 450 may be formed on the first insulation layer 470, and the second sensor 460 may be formed on the second insulation layer 471 positioned on the first sensor 450. According to the embodiment, the second sensor 460 may be covered with a third insulation layer 472. In other words, the sensor sheet 440 may include the first to the third insulation layers 470 to 472, the first sensor 450, and the second sensor 460. Here, since the first sensor 450 and the second sensor 460 are disposed in different layers, they can be implemented so as to overlap each other. For example, the first sensor 450 and the second sensor 460 may be, as shown in FIG. 15c, formed similarly to the pattern of the drive electrode TX and receiving electrode RX which are arranged in the form of M×N array. Here, M and N may be natural numbers greater than 1. Also, as shown in FIG. 15a, the lozenge-shaped first and the second sensors 450 and 460 may be disposed in different layers respectively.

In the foregoing, it is shown that the touch pressure is detected from the change of the mutual capacitance between the first sensor 450 and the second sensor 460. However, the sensor sheet 440 may be configured to include only any one of the first sensor 450 and the second sensor 460. In this case, it is possible to detect the magnitude of the touch pressure by detecting the change of the capacitance between the one pressure sensor and a ground layer (the display module 200, the substrate 300, or the reference potential layer disposed within the display module 200), that is to say, the self-capacitance. Here, the drive signal is applied to the one pressure sensor, and the change of the self-capacitance between the pressure sensor and the ground layer can be detected by the pressure sensor.

For instance, in FIG. 4c, the pressure sensor included in the sensor sheet 440 may be configured to include only the first sensor 450. Here, the magnitude of the touch pressure can be detected by the change of the capacitance between the first sensor 450 and the display module 200, which is caused by a distance change between the display module 200 and the first sensor 450. Since the distance "d" is reduced with the increase of the touch pressure, the capacitance between the display module 200 and the first sensor 450 may be increased with the increase of the touch pressure. This can be applied in the same manner to the embodiment related to FIG. 4e. Here, the pressure sensor should not necessary have a comb teeth shape or a trident shape, which is required to improve the detection accuracy of the mutual capacitance change amount. The pressure sensor may have, as shown in FIG. 7d, a plate shape (e.g., quadrangular plate). Alternatively, the plurality of first sensors 450 may be, as shown in FIG. 15d, disposed at a regular interval in the form of a grid.

A cross section when the sensor sheet 440 is formed to include only the first sensor 450 is shown in (c) of FIG. 9. As shown in (c) of FIG. 9, the sensor sheet 440 including the first sensor 450 may be disposed on the substrate 300 or on the display module 200.

FIG. 4f shows that the pressure sensors 450 and 460 are formed within the spacer layer 420 and on the top surface of the substrate 300 and on the bottom surface of the display module 200. The sensor sheet may include a first sensor sheet 440-1 including the first sensor 450 and a second sensor sheet 440-2 including the second sensor 460. Here, any one of the first sensor 450 and the second sensor 460 may be formed on the substrate 300, and the other may be formed on the bottom surface of the display module 200. FIG. 4f shows that the first sensor 450 is formed on the substrate 300, and the second sensor 460 is formed on the bottom surface of the display module 200.

Here, as shown in FIG. 4g, the first sensor 450 may be directly formed on the bottom surface of the display panel 200A and the second sensor 460 may be disposed on the top surface of the substrate 300 in the form of the sensor sheet such that the second sensor 460 is formed on the first insulation layer 470 and the second insulation layer 471 is formed on the second sensor 460.

When the pressure is applied to the surface of the cover layer 100 by the object 500, the cover layer 100 and the display module 200 may be bent or pressed. As a result, a distance "d" between the first sensor 450 and the second sensor 460 may be reduced. In this case, the mutual capacitance between the first sensor 450 and the second sensor 460 may be increased with the reduction of the distance "d". Therefore, the magnitude of the touch pressure can be calculated by obtaining the increase amount of the mutual capacitance from the sensing signal obtained through the receiving sensor. Here, the patterns of the first sensor 450 and the second sensor 460 may have a shape as shown in FIG. 7d respectively. That is, since the first sensor 450 and the second sensor 460 are formed in different layers in FIG. 4f, the first sensor 450 and the second sensor 460 should not necessary have a comb teeth shape or a trident shape. One of the first sensor 450 and the second sensor 460 may have a plate shape (e.g., quadrangular plate) and the other may have, as shown in FIG. 15d, a shape that the plurality of the sensors are disposed at a regular interval in the form of a grid. A cross section when the first sensor sheet 440-1 including the first sensor 450 is attached to the substrate 300 and the second sensor sheet 440-2 including the second sensor 460 is attached to the display module 200 is shown in (d) of FIG. 9. As shown in (d) of FIG. 9, the first sensor sheet 440-1 including the first sensor 450 may be disposed on the substrate 300. Also, the second sensor sheet 440-2 including the second sensor 460 may be disposed on the bottom surface of the display module 200.

As with the description related to (a) of FIG. 9, when substrate 300 or the display module 200 on which the pressure sensors 450 and 460 are attached may not have the ground potential or may have a weak ground potential, the sensor sheet 440 may further include, as shown in (a) to (d) of FIG. 9, a ground electrode (not shown) between the first insulation layers 470, 470-1, and 470-2 and the substrate 300 or the display module 200. Here, the sensor sheet 440 may further include an additional insulation layer (not shown) between the ground electrode (not shown) and the substrate 300 or the display module 200.

FIGS. 5a to 5i show a second example in which the sensor sheet according to the embodiment of the present invention is applied to the touch input device. The second example of the present invention is similar to the first example described with reference to FIGS. 4a to 4f. Hereafter, the following description will focus on differences between the first and second examples.

FIG. 5a is a cross sectional view of the touch input device in which the sensor sheet 440 has been disposed according to the second example.

In the touch input device 1000 according to the second example of the present invention, the touch pressure can be detected by using the air gap and/or potential layer which are positioned inside or outside the display module 200 without manufacturing a separate spacer layer and/or reference potential layer. This will be described in detail with reference to FIGS. 5b to 5i.

FIG. 5b is an exemplary cross sectional view of the display module 200 which can be included in the touch input device 1000 according to the second example of the present invention. FIG. 5b shows an LCD module as the display module 200. As shown in FIG. 5b, the display module 200 that is an LCD module may include the backlight unit 200B and the display panel 200A that is an LCD panel. The LCD panel cannot emit light in itself and simply performs a function of blocking or transmitting the light. Therefore, a light source is positioned below the LCD panel 200A and light is illuminated onto the LCD panel, so that a screen displays not only brightness and darkness but information with various colors. Since the LCD panel is a passive device and cannot emit the light in itself, a light source having a uniform luminance distribution is required on the rear side. The structures and functions of the LCD panel and the backlight unit have been already known to the public and will be briefly described below.

The backlight unit 200B for the LCD panel may include several optical parts. In FIG. 5b, the backlight unit 200B may include a light diffusing and light enhancing sheet 231, a light guide plate 232, and a reflection plate 240. Here, the backlight unit 200B may include a light source (not shown) which is formed in the form of a linear light source or point light source and is disposed on the rear and/or side of the light guide plate 232. According to the embodiment, a support 233 may be further included on the edges of the light guide plate 232 and the light diffusing and light enhancing sheet 231.

The light guide plate 232 may generally convert lights from the light source (not shown) in the form of a linear light source or point light source into light from a light source in the form of a surface light source, and allow the light to proceed to the LCD panel.

A part of the light emitted from the light guide plate 232 may be emitted to a side opposite to the LCD panel and be lost. The reflection plate 240 may be positioned below the light guide plate 232 so as to cause the lost light to be incident again on the light guide plate 232, and may be made of a material having a high reflectance.

The light diffusing and light enhancing sheet 231 may include a diffuser sheet and/or a prism sheet. The diffuser sheet functions to diffuse the light incident from the light guide plate 232. For example, light scattered by the pattern of the light guide plate 232 comes directly into the eyes of the user, and thus, the pattern of the light guide plate 232 may be shown as it is. Moreover, since such a pattern can be clearly sensed even after the LCD panel is mounted, the diffuser sheet is able to perform a function to offset the pattern of the light guide plate 232.

After the light passes through the diffuser sheet, the luminance of the light is rapidly reduced. Therefore, the prism sheet may be included in order to improve the luminance of the light by focusing the light again.

The backlight unit 200B may include a configuration different from the above-described configuration in accordance with the technical change and development and/or the embodiment. The backlight unit 200B may further include an additional configuration as well as the foregoing configuration. Also, in order to protect the optical configuration of the backlight unit 200B from external impacts and contamination, etc., due to the introduction of the alien substance, the backlight unit 200B according to the embodiment of the present may further include, for example, a protection sheet on the prism sheet. The backlight unit 200B may also further include a lamp cover in accordance with the embodiment so as to minimize the optical loss of the light source. The backlight unit 200B may also further include a frame which maintains a shape enabling the light diffusing and light enhancing sheet 231, the light guide plate 232, a lamp (not shown), and the like, which are main components of the backlight unit 200B, to be exactly combined together in accordance with an allowed dimension. Also, the each of the components may be comprised of at least two separate parts. For example, the prism sheet may include two prism sheets.

Here, a first air gap 220-2 may be positioned between the light guide plate 232 and the reflection plate 240. As a result, the lost light from the light guide plate 232 to the reflection plate 240 can be incident again on the light guide plate 232 by the reflection plate 240. Here, between the light guide plate 232 and the reflection plate 240, for the purpose of maintaining the first air gap 220-2, a display module frame 221-2 may be included on the edges of the light guide plate 232 and the reflection plate 240.

Also, according to the embodiment, the backlight unit 200B and the LCD panel may be positioned with the second air gap 220-1 placed therebetween. This intends to prevent that the impact from the LCD panel is transmitted to the backlight unit 200B. Here, between the backlight unit 200B and the LCD panel 200A, a display module frame 221-1 may be included between the LCD panel and the backlight unit 200B and on the edges of the LCD panel and the backlight unit 200B so as to maintain the second air gap 220-1.

Here, the display module frames 221-1 and 221-2 may be made of an inelastic material. In the embodiment of the present invention, when a pressure is applied to the display module 200, the display module 200 may be bent. Therefore, the magnitude of the touch pressure can be detected by the change of the distance between the light diffusing and light enhancing sheet 231 and the LCD panel or the distance between the light guide plate 232 and the reflection plate 240 even though the display module frames 221-1 and 221-2 are not deformed by the pressure.

As described above, the display module 200 may be configured to include in itself the air gap such as the first air gap 220-2 and/or the second air gap 220-1. Also, the air gap may be included between a plurality of the layers of the light diffusing and light enhancing sheet 231. In the foregoing, while the LCD module has been described, the air gap may be included within the structure of another display module.

Also, the touch input device 1000 according to the embodiment of the present invention may further include a cover (not shown) under the display module 200. The cover may be made of a metal for protecting the reflection plate 240 from contamination due to the introduction of the alien substance, external impacts, etc. In this case, the substrate 300 according to the embodiment of the present invention may be a cover member. A separate cover (not shown) may be disposed between the substrate 300 and the display module 200.

Therefore, for detecting the touch pressure, the touch input device 1000 according to the second example of the present invention may make use of the air gap which has been already positioned inside or outside the display module 200 without manufacturing a separate spacer layer. The air gap which is used as the spacer layer may be not only the first air gap 220-2 and/or the second air gap 220-1 which are described with reference to FIG. 5b but also any air gap included inside the display module 200. Also, the air gap which is used as the spacer layer may be an air gap included outside the display module 200. As such, the sensor sheet 440 capable of detecting the touch pressure is inserted into the touch input device 1000, so that the manufacturing cost can be reduced and/or the manufacturing process can be simplified. FIG. 5c is a perspective view of the touch input device according to the second example of the present invention. In FIG. 5c, unlike the first example shown in FIG. 4b, the height of the frame 330 is formed to be similar to the thicknesses of the display module 200 and the sensor sheet 440, so that a separate spacer layer for the pressure detection may not be included in the touch input device 1000.

FIG. 5d is a cross sectional view of the touch input device according to the second example. As shown in FIG. 5d, between the display module 200 and the substrate 300, the sensor sheet 440 including the pressure sensors 450 and 460 may be formed on the substrate 300. In FIGS. 5d to 5i, the pressure sensors 450 and 460 are shown exaggeratedly thick for convenience of description. However, since the pressure sensors 450 and 460 can be implemented in the form of a sheet, the thicknesses of the first and second sensors 450 and 460 may be very small. Likewise, although a distance between the display module 200 and the substrate 300 is also shown exaggeratedly large, the display module 200 and the substrate 300 may be implemented to have a very small distance therebetween. FIGS. 5d and 5e show that the display module 200 and the pressure sensors 450 and 460 are spaced apart from each other so as to represent that the sensor sheet 440 including the pressure sensors 450 and 460 have been formed on the substrate 300. However, this is for description only. The display module 200 and the first and second sensors 450 and 460 may not be spaced apart from each other.

Here, FIG. 5d shows that the display module 200 includes a spacer layer 220, the display module frame 221, and a reference potential layer 270.

The spacer layer 220 may be, as described with reference to FIG. 5b, the first air gap 220-2 and/or the second air gap 220-1 which are included during the manufacture of the display module 200. When the display module 200 includes one air gap, the air gap may function as the spacer layer 220. When the display module 200 includes a plurality of air gaps, the plurality of air gaps may collectively function as the spacer layer 220. FIGS. 5d, 5e, 5h and 5i show that the display module 200 functionally includes one spacer layer 220.

According to the second example of the present invention, the touch input device 1000 may include the reference potential layer 270 which is positioned above the spacer layer 220 within the display module 200 of FIGS. 2b to 2c. The reference potential layer 270 may be a ground potential layer which is included in itself during the manufacture of the display module 200. For example, in the display module 200 shown in FIGS. 2b to 2c, an electrode (not shown) for blocking the noise may be included between the first polarizer layer 271 and the first substrate layer 261. The electrode for blocking the noise may be composed of ITO and may function as the ground. Within the display module 200, the reference potential layer 270 may be located at any position causing the spacer layer 220 to be placed between the reference potential layer 270 and the pressure sensors 450 and 460. Not only the above-described blocking electrode but also an electrode having any potential may be used as the reference potential layer 270. For example, the reference potential layer 270 may be a common electrode potential (Vcom) layer of the display module 200.

Particularly, as part of an effort to reduce the thickness of the device including the touch input device 1000, the display module 200 may not be surrounded by a separate cover or frame. In this case, the bottom surface of the display module 200, which faces the substrate 300, may be the reflection plate 240 and/or a nonconductor. In this case, the bottom surface of the display module 200 cannot have the ground potential. As mentioned, even when the bottom surface of the display module 200 cannot function as the reference potential layer, it is possible to detect the touch pressure by using any potential layer positioned within the display module 200 as the reference potential layer 270 through use of the touch input device 1000 according to the second example.

FIG. 5e is a cross sectional view of a case where a pressure has been applied to the touch input device 1000 shown in FIG. 5d. When pressure is applied to the surface of the cover layer 100 by the object 500, the cover layer 100 or the display module 200 may be bent or pressed. Here, a distance "d" between the reference potential layer 270 and the pressure sensors 450 and 460 may be decreased to "d'" by the spacer layer 220 positioned within the display module 200. In this case, due to the decrease of the distance "d", the fringing capacitance is absorbed in the reference potential layer 270, so that the mutual capacitance between the first sensor 450 and the second sensor 460 may be reduced. Therefore, the magnitude of the touch pressure can be calculated by obtaining the reduction amount of the mutual capacitance from the sensing signal obtained through the receiving sensor.

Here, the display module frame 221 may be made of an inelastic material. In the embodiment of the present invention, when a pressure is applied to the display module 200, the display module 200 may be bent. Therefore, the magnitude of the touch pressure can be detected by the change of the distance between the reference potential layer 270 and the pressure sensors 450 and 460 even though the display module frame 221 is not deformed by the pressure.

In the touch sensor panel 100 according to the second example of the present invention, the display module 200 may be bent or pressed by the touch pressure. Here, as shown in FIG. 5e, due to the spacer layer 220, the layer positioned below the spacer layer 220 (e.g., the reflection plate) may not be bent or pressed or may be less bent or pressed. While FIG. 5e shows that the lowest portion of the display module 200 is not bent or pressed at all, this is just an example. The lowest portion of the display module 200 may be bent or pressed. However, the degree to which the lowest portion of the display module 200 is bent or pressed can be reduced by the spacer layer 220.

Since the structure of the sensor sheet 440 including the pressure sensor according to the second example and how to attach the sensor sheet 440 are the same as those described with reference to the first example, the description thereof will be omitted.

FIG. 5f is a cross sectional view of the touch input device including the pressure sensor according to the modification of the embodiment described with reference to FIG. 5d. FIG. 5f shows that the spacer layer 220 is positioned between the display module 200 and the substrate 300. When the touch input device 1000 including the display module 200 is manufactured, the display module 200 is not completely attached to the substrate 300, so that the air gap 420 may be created. Here, by using the air gap 420 as the spacer layer for detecting the touch pressure, it is possible to reduce the time and cost required for intentionally manufacturing the spacer layer for detecting the touch pressure. FIGS. 5f and 5g show that the spacer layer 420, i.e., the air gap is not positioned within the display module 200. However, FIGS. 5f and 5g may additionally include a case where the spacer layer 220 is positioned within the display module 200.

FIG. 5g is a cross sectional view of a case where a pressure has been applied to the touch input device shown in FIG. 5f. As with FIG. 5d, when the touch occurs on the touch input device 1000, the display module 200 may be bent or pressed. Here, the "d" between the reference potential layer 270 and the pressure sensors 450 and 460 may be decreased to "d'" by the spacer layer 420 which is positioned between the reference potential layer 270 and the pressure sensors 450 and 460. As a result, the magnitude of the touch pressure can be calculated by obtaining the reduction amount of the mutual capacitance from the sensing signal obtained through the receiving sensor.

Here, though not shown in FIG. 5g, a frame for maintaining the distance between the display module 200 and the substrate 300 may be formed on the edge of the display module 200 or the substrate 300. Here, the frame may be made of an inelastic material. In the embodiment of the present invention, when a pressure is applied to the display module 200, the display module 200 may be bent. Therefore, the magnitude of the touch pressure can be detected by the change of the distance between the reference potential layer 270 and the pressure sensors 450 and 460 even though the frame is not deformed by the pressure.

FIG. 5h shows that the sensor sheet 440 including the pressure sensors 450 and 460 is disposed on the bottom surface of the display module 200. The distance "d" between the reference potential layer 270 and the pressure sensors 450 and 460 is reduced by touching the touch surface. Consequently, this may cause the change of the mutual capacitance between the first sensor 450 and the second sensor 460. FIG. 5h shows that the substrate 300 and the pressure sensors 450 and 460 are spaced apart from each other so as to describe that the pressure sensors 450 and 460 are attached to the display module 200. However, this is for description only. The substrate 300 and the pressure sensors 450 and 460 may not be spaced apart from each other. Also, as with FIGS. 5f and 5g, the display module 200 and the substrate 300 may be spaced apart from each other by the spacer layer 420.

Similarly to the first example, the pressure sensors 450 and 460 described with reference to FIGS. 5d to 5h according to the second example may also have the pattern shown in FIGS. 7a to 7c, and repetitive descriptions thereof will be omitted.

FIG. 5i shows that the first sensor sheet 440-1 and the second sensor sheet 440-2, each of which includes the pressure sensor 450 and the pressure sensor 460 respectively, are disposed on the top surface of the substrate 300 and on the bottom surface of the display module 200 respectively. FIG. 5i shows that the first sensor 450 is formed on the substrate 300, and the second sensor 460 is formed on the bottom surface of the display module 200. FIG. 5i shows that the first sensor 450 is spaced apart from the second sensor 460. However, this is just intended to describe that the first sensor 450 is formed on the substrate 300 and the second sensor 460 is formed on the display module 200. The first sensor 450 and the second sensor 460 may be spaced apart from each other by the air gap, may have an insulating material placed therebetween, or may be formed to deviate from each other, for example, may be formed in the same layer, not to be overlapped with each other.

When pressure is applied to the surface of the touch surface by the object 500, the cover layer 100 and the display module 200 may be bent or pressed. As a result, the distance "d" between the pressure sensors 450 and 460 and the reference potential layer 270 may be reduced. In this case, the mutual capacitance between the first sensor 450 and the second sensor 460 may be reduced with the reduction of the distance "d". Therefore, the magnitude of the touch pressure can be calculated by obtaining the reduction amount of the mutual capacitance from the sensing signal obtained through the receiving sensor. Here, the first sensor 450 and the second sensor 460 may have the pattern shown in FIG. 7e. As shown in FIG. 7e, the first sensor 450 and the second sensor 460 are disposed perpendicular to each other, so that the capacitance change amount detection sensitivity can be enhanced.

FIGS. 6a to 6h show a touch input device according to a third example of the present invention. The third example is similar to the first example. The following description will focus on differences between them.

FIG. 6a is a cross sectional view of the touch input device according to the third example of the present invention. In the third example, the sensor sheet 440 including the pressure sensors 450 and 460 included in the pressure detection module 400 may be inserted into the touch input device 1000. Here, FIG. 6a shows that the sensor sheet 440 including the pressure sensors 450 and 460 is disposed apart from the display module 200. However, the sensor sheet 440 including the pressure sensors 450 and 460 may be formed to contact the display module 200.

In the touch input device 1000 according to the third example of the present invention, for the purpose of detecting the touch pressure, the sensor sheet 440 may be attached to the display module 200 such that the sensor sheet 440 and either the substrate 300 or the display module 200 are spaced apart from each other with the spacer layer 420 placed therebetween.

FIG. 6b is a partial cross sectional view of the touch input device including the sensor sheet 440 attached thereto according to a first method. FIG. 6b shows that the sensor sheet 440 has been attached on the substrate 300 or the display module 200.

As shown in FIG. 6c, a sensor sheet frame 430 with a predetermined thickness may be formed along the border of the sensor sheet 440 in order to maintain the spacer layer 420. While FIG. 6c shows the sensor sheet frame 430 is formed at the entire border (e.g., four sides of the quadrangle) of the sensor sheet 440, the sensor sheet frame 430 may be formed only on at least some (e.g., three sides of the quadrangle) of the border of the sensor sheet 440. Here, as shown in FIG. 6c, the sensor sheet frame 430 may not formed in a region including the pressure sensors 450 and 460. As a result, when the sensor sheet 440 is attached to the substrate 300 of the display module 200 by the sensor sheet frame 430, the pressure sensors 450 and 460 may be spaced apart from the substrate 300 of the display module 200 by a predetermined distance. According to the embodiment, the sensor sheet frame 430 may be formed on the top surface of the substrate 300 or on the bottom surface of the display module 200. Also, the sensor sheet frame 430 may be a double adhesive tape. FIG. 6c shows that the sensor sheet 440 includes only one out of the pressure sensors 450 and 460.

FIG. 6d is a partial cross sectional view of the touch input device including the sensor sheet 440 attached thereto according to a second method. In FIG. 6d, after the sensor sheet 440 is positioned on the substrate 300 or the display module 200, the sensor sheet 440 can be fixed to the substrate 300 or the display module 200 by means of an adhesive tape 431. For this, the adhesive tape 431 may contact at least a portion of the sensor sheet 440 and at least a portion of the substrate 300 or the display module 200. FIG. 6d shows that the adhesive tape 431 continues from the top of the sensor sheet 440 to the exposed surface of the substrate 300 or the display module 200. Here, only the surface of the adhesive tape 431, the surface contacting the sensor sheet 440, may have an adhesive strength. Accordingly, in FIG. 6d, the top surface of the adhesive tape 431 may have no adhesive strength.

As shown in FIG. 6d, even though the sensor sheet 440 is fixed to the substrate 300 or the display module 200 by the adhesive tape 431, a predetermined space, i.e., the air gap may be created between the sensor sheet 440 and either the substrate 300 or the display module 200. That is to say, the adhesive tape 431 can serve as the sensor sheet frame 430.

This is because the sensor sheet 440 is not directly attached to either the substrate 300 or the display module 200 by an adhesive and because the sensor sheet 440 includes the pressure sensors 450 and 460 having a pattern, so that the surface of the sensor sheet 440 may not be flat. The air gap 420 of FIG. 6d may also function as the spacer layer 420 for detecting the touch pressure.

In the following description, the third example has been described with reference to a case where the sensor sheet 440 is attached t to the substrate 300 or the display module 200 by the first method shown in FIG. 6b. However, the description can be applied to a case where the sensor sheet 440 is attached and spaced from the substrate 300 or the display module 200 by any method like the second method, etc.

FIG. 6e is a cross sectional view of the touch input device including the pressure sensor pattern according to the third example of the present invention. As shown in FIG. 6e, the sensor sheet 440 including the pressure sensors 450 and 460 may be attached to the substrate 300 such that, particularly, the region where the pressure sensors 450 and 460 have been formed is spaced from the substrate 300 by the spacer layer 420. While FIG. 6e shows that the display module 200 contacts the sensor sheet 440, this is just an example. The display module 200 may be positioned apart from the sensor sheet 440.

FIG. 6f is a cross sectional view of a case where a pressure has been applied to the touch input device 1000 shown in FIG. 6e. The substrate 300 may have a ground potential so as to block the noise. When the pressure is applied to the touch surface by the object 500, the cover layer 100 and the display module 200 may be bent or pressed. As a result, the sensor sheet 440 is pressed, so that the distance "d" between the substrate 300 and the pressure sensors 450 and 460 included in the sensor sheet 440 may be decreased to "d'". In this case, due to the decrease of the distance "d", the fringing capacitance is absorbed in the substrate 300, so that the mutual capacitance between the first sensor 450 and the second sensor 460 may be reduced. Therefore, the magnitude of the touch pressure can be calculated by obtaining the reduction amount of the mutual capacitance from the sensing signal obtained through the receiving sensor.

As shown in FIGS. 6e and 6f, the touch input device 1000 according to the third example of the present invention is able to detect the touch pressure by the distance change between the sensor sheet 440 and the substrate 300 to which the sensor sheet 440 has been attached. Here, since the distance "d" between the sensor sheet 440 and the substrate 300 is very small, the touch input device 1000 is able to precisely detect the touch pressure even by the minute change in the distance "d" due to the touch pressure.

FIG. 6g shows that the pressure sensors 450 and 460 are attached to the bottom surface of the display module 200. FIG. 6h is a cross sectional view of a case where a pressure has been applied to the touch input device shown in FIG. 6g. Here, the display module 200 may have the ground potential. Therefore, a distance "d" between the display module 200 and the pressure sensors 450 and 460 is reduced by touching the touch surface of the cover layer 100. Consequently, this may cause the change of the mutual capacitance between the first sensor 450 and the second sensor 460.

As shown in FIGS. 6g and 6h, it can be understood that the touch input device 1000 according to the third example of the present invention can also detect the touch pressure by a distance change between the sensor sheet 440 and the display module 200 to which the sensor sheet 440 has been attached.

For example, the distance between the display module 200 and the sensor sheet 440 may be less than the distance between the sensor sheet 440 and the substrate 300. Also, for example, the distance between the sensor sheet 440 and the bottom surface of the display module 200 having the ground potential may be less than the distance between the sensor sheet 440 and the Vcom potential layer and/or any ground potential layer. For example, in the display module 200 shown in FIGS. 2*b* to 2*c*, an electrode (not shown) for blocking the noise may be included between the first polarizer layer 271 and the first substrate layer 261. The electrode for blocking the noise may be composed of ITO and may function as the ground.

The first sensor 450 and the second sensor 460 which are included in FIGS. 6*e* to 6*h* may have the pattern shown in FIGS. 7*a* to 7*c*, and repetitive descriptions thereof will be omitted.

In FIGS. 6*a* to 6*h*, it is shown that the first sensor 450 and the second sensor 460 are formed in the same layer. However, it can be considered that the first sensor 450 and the second sensor 460 are formed in different layers in accordance with the embodiment. As shown in (b) of FIG. 9, in the sensor sheet 440, the first sensor 450 may be formed on the first insulation layer 470, and the second sensor 460 may be formed on the second insulation layer 471 positioned on the first sensor 450. The second sensor 460 may be covered with the third insulation layer 472.

Also, according to the embodiment, the pressure sensors 450 and 460 may be configured to include only any one of the first sensor 450 and the second sensor 460. In this case, it is possible to detect the magnitude of the touch pressure by detecting the change of the capacitance between the one pressure sensor and the ground layer (either the display module 200 or the substrate 300), that is to say, the self-capacitance. Here, the pressure sensor may have, as shown in FIG. 7*d*, a plate shape (e.g., quadrangular plate). Here, as shown in (c) of FIG. 9, in the sensor sheet 440, the first sensor 450 may be formed on the first insulation layer 470 and may be covered with the third insulation layer 472.

FIGS. 8*a* and 8*b* show a relation between the magnitude of the touch pressure and a saturated area in the touch input device to which the sensor sheet 440 has been applied according to the embodiment of the present invention. Although FIGS. 8*a* and 8*b* show that the sensor sheet 440 is attached to the substrate 300, the following description can be applied in the same manner to a case where the sensor sheet 440 is attached to the display module 200. The touch pressure with a sufficient magnitude makes a state where the distance between the sensor sheet 440 and the substrate 300 cannot be reduced any more at a predetermined position. Hereafter, the state is designated as a saturation state. For instance, as shown in FIG. 8*a*, when the touch input device 1000 is pressed by a force "f", the sensor sheet 440 contacts the substrate 300, and thus, the distance between the sensor sheet 440 and the substrate 300 cannot be reduced any more. Here, as shown on the right of FIG. 8*a*, the contact area between the sensor sheet 440 and the substrate 300 may be indicated by "a".

However, in this case, when the magnitude of the touch pressure becomes larger, the contact area between the sensor sheet 440 and the substrate 300 in the saturation state where the distance between the sensor sheet 440 and the substrate 300 cannot be reduced any more may become greater. For example, as shown in FIG. 8*b*, when the touch input device 1000 is pressed by a force "F" greater than the force "f", the contact area between the sensor sheet 440 and the substrate 300 may become greater. As shown on the right of FIG. 8*b*, the contact area between the sensor sheet 440 and the substrate 300 may be indicated by "A". As such, the greater the contact area, the more the mutual capacitance between the first sensor 450 and the second sensor 460 may be reduced. Hereafter, it will be described that the magnitude of the touch pressure is calculated by the change of the capacitance according to the distance change. This may include that the magnitude of the touch pressure is calculated by the change of the saturation area in the saturation state.

FIGS. 8*a* and 8*b* are described with reference to the third example. It is apparent that the description with reference to FIGS. 8*a* and 8*b* can be applied in the same manner to the first to second examples and the following fourth example More specifically, the magnitude of the touch pressure can be calculated by the change of the saturation area in the saturation state where the distance between the pressure sensors 450 and 460 and either the ground layer or the reference potential layer 200, 300, and 270 cannot be reduced any more.

FIGS. 10*a* and 10*b* show a touch input device according to a fourth example of the present invention. The touch input device 1000 according to the fourth example of the present invention can sense the touch pressure by inserting the sensor sheet 440 even when the pressure is applied to the bottom surface as well as the top surface of the touch input device. In this specification, the top surface of the touch input device 1000 as the touch surface may be designated as the top surface of the display module 200 and may include not only the top surface of the display module 200 but also the surface of a member covering the top surface of the display module 200. Also, in this specification, the bottom surface of the touch input device 1000 as the touch surface may be designated as the bottom surface of the substrate 300 and may include not only the bottom surface of the substrate 300 but also the surface of a member covering the bottom surface of the substrate 300.

FIG. 10*a* shows that the sensor sheet 440 including the pressure sensors 450 and 460 is positioned on the bottom surface of the display module 200 in the first example. FIG. 10*a* shows that the distance between the substrate 300 and the pressure sensors 450 and 460 is changed when the substrate 300 is pressed or bent by applying a pressure to the bottom surface of the substrate 300. Here, as the distance between the pressure sensors 450 and 460 and the substrate 300, i.e., the reference potential layer is changed, the capacitance between the first sensor 450 and the second sensor 460 or the capacitance between the substrate 300 and either the first sensor 450 or the second sensor 460 is changed. Accordingly, the touch pressure can be detected.

FIG. 10*b* shows that the sensor sheet 440 is attached to the substrate 300 in the third example. FIG. 10*b* shows that the distance between the substrate 300 and the sensor sheet 440 is changed when the substrate 300 is pressed or bent by applying a pressure to the bottom surface of the substrate 300. As with the case of FIG. 10*a*, as the distance between the pressure sensors 450 and 460 and the substrate 300, i.e., the reference potential layer is changed, the capacitance between the first sensor 450 and the second sensor 460 or the capacitance between the substrate 300 and either the first sensor 450 or the second sensor 460 is changed. Accordingly, the touch pressure can be detected.

In FIGS. 10*a* and 10*b*, while the fourth example has been described based on the structures of some of the first and third examples, the fourth example can be applied to a case where the substrate 300 is bent or pressed by applying a pressure to the bottom surface of the substrate 300 included in the structures of the first to the third examples, so that the capacitance between the first sensor 450 and the second sensor 460 is changed or the capacitance between the first sensor 450 and the reference potential layer 200, 300, and 270 is changed. For example, in the structure shown in FIG. 4*c*, when the substrate 300 is bent or pressed, the distance between the display module 200 and the pressure sensors 450 and 460 may be changed, thereby detecting the pressure.

The pressure sensing unit according to the embodiment of the present invention may be formed directly on the display panel 200A. FIGS. 14*a* to 14*c* are cross sectional views showing an embodiment of the pressure sensing unit formed directly on various display panels 200A.

First, FIG. 14*a* shows the pressure sensing unit formed on the display panel 200A using the LCD panel. Specifically, as shown in FIG. 14*a*, the pressure sensing unit including the pressure sensors 450 and 460 may be formed on the bottom surface of the second substrate layer 262. Here, the pressure sensors 450 and 460 may be formed on the bottom surfaces of the second polarization layer 272. In detecting the touch pressure on the basis of the mutual capacitance change amount when a pressure is applied to the touch input device 1000, a drive signal is applied to the drive sensor 450, and an electrical signal including information on the capacitance which is changed by the distance change between the pressure sensors 450 and 460 and the reference potential layer separated from the pressure sensors 450 and 460 is received from the receiving sensor 460. When the touch pressure is detected on the basis of the self-capacitance change amount, a drive signal is applied to the pressure sensors 450 and 460, and an electrical signal including information on the capacitance which is changed by the distance change between the pressure sensors 450 and 460 and the reference potential layer separated from the pressure sensors 450 and 460 is received from the pressure sensors 450 and 460. Here, the reference potential layer may be the substrate 300 or may be the cover which is disposed between the display panel 200A and the substrate 300 and performs a function of protecting the display panel 200A.

Next, FIG. 14*b* shows the pressure sensing unit formed on the bottom surface of the display panel 200A using the OLED panel (in particular, AM-OLED panel). Specifically, the pressure sensing unit including the pressure sensors 450 and 460 may be formed on the bottom surface of the second substrate layer 283. Here, a method for detecting the pressure is the same as that described in FIG. 14*a*.

Regarding the OLED panel, since the light is emitted from the organic material layer 280, the pressure sensors 450 and 460 formed on the bottom surface of the second substrate layer 283 disposed under the organic material layer 280 may be made of an opaque material. However, in this case, the pattern of the pressure sensors 450 and 460 formed on the bottom surface of the display panel 200A may be visible to the user. Therefore, in order that the pressure sensors 450 and 460 are formed directly on the bottom surface of the second substrate layer 283, after a light shielding layer such as black ink is applied on the bottom surface of the second substrate layer 283, the pressure sensors 450 and 460 can be formed on the light shielding layer.

Also, while FIG. 5*b* shows that the pressure sensors 450 and 460 are formed on the bottom surface of the second substrate layer 283, a third substrate layer (not shown) may be formed under the second substrate layer 283 and the pressure sensors 450 and 460 are formed on the bottom surface of the third substrate layer. In particular, when the display panel 200A is a flexible OLED panel, the third substrate layer which is not relatively easily bent may be disposed under the second substrate layer 283 because the display panel 200A composed of the first substrate layer 281, the organic material layer 280, and the second substrate layer 283 is very thin and easily bent.

Next, FIG. 14*c* shows the pressure sensing unit formed within the display panel 200A using the OLED panel. Specifically, the pressure sensing unit including the pressure sensors 450 and 460 may be formed on the top surface of the second substrate layer 283. Here, a method for detecting the pressure is the same as that described in FIG. 14*a*.

Also, although the display panel 200A using the OLED panel has been described by taking an example thereof with reference to FIG. 14*c*, it is possible that the pressure sensors 450 and 460 are formed on the top surface of the second substrate layer 283 of the display panel 200A using the LCD panel.

Also, although it has been described in FIGS. 14*a* to 14*c* that the pressure sensing unit including the pressure sensors 450 and 460 is formed on the top surfaces or bottom surfaces of the second substrate layers 262 and 283, it is possible that the pressure sensing unit is formed on the top surfaces or bottom surfaces of the first substrate layers 261 and 281.

Also, it has been described in FIGS. 14*a* to 14*c* that the pressure sensing unit including the pressure sensors 450 and 460 is directly formed on the display panel 200A. However, the pressure sensing unit may be directly formed on the substrate 300, and the potential layer may be the display panel 200A or may be the cover which is disposed between the display panel 200A and the substrate 300 and performs a function of protecting the display panel 200A.

Also, although it has been described in FIGS. 14*a* to 14*c* that the reference potential layer is disposed under the pressure sensing unit, the reference potential layer may be disposed within the display panel 200A. Specifically, the reference potential layer may be disposed on the top surface or bottom surface of the first substrate layers 261 and 281 of the display panel 200A or may be disposed on the top surface or bottom surface of the second substrate layers 262 and 283.

In the touch input device 1000 according to the embodiment of the present invention, the pressure sensing unit for sensing the capacitance change amount may be composed of the first sensor 450 which is directly formed on the display panel 200A and the second sensor 460 which is configured in the form of the sensor sheet. Specifically, the first sensor 450 may be, as described in FIGS. 14*a* to 14*c*, directly formed on the display panel 200A, and second sensor 460 may be, as described in FIGS. 4 to 5, configured in the form of the sensor sheet and may be attached to the touch input device 1000.

In the state where the pressure sensing unit in the form of the sensor sheet 440 according to the embodiment of the present invention has been, as shown in FIGS. 4 to 10, attached to the touch input device, or in the state where the pressure sensing unit has been, as shown in FIG. 14, formed directly on the touch input device, the magnitude of the touch pressure is detected from change amount of the electrical characteristics detected from the pressure sensors 450 and 460. Here, since the electrical characteristics detected from the pressure sensors 450 and 460 is changed by the change of ambient environment including display noise as well as by the actually applied pressure, the accuracy of the capacitance becomes poor. Particularly, when the pressure sensing unit is, as shown in FIGS. 14*a* to 14*c*, formed directly on the touch input device, the distance between the pressure sensing unit and the display drive unit becomes small. Therefore, as the display is driven, the electrical characteristics detected from the pressure sensors 450 and 460 may be significantly changed. Accordingly, only when it is possible to detect only the change amount of the electrical characteristics by the pressure actually applied to the pressure sensors 450 and 460 except for the change amount of the electrical characteristics by the change of ambient environment including the display noise among the detected change amount of the electrical characteristics, the magnitude of the touch pressure can be accurately detected.

For this, a reset process can be intended to be repeatedly performed whenever a scan in which the drive signal is applied to the pressure sensors 450 and 460 and the sensing signal is received from the pressure sensors 450 and 460 is performed, or in a predetermined cycle. The reset process resets reference electrical characteristics to a reset time. This reset process is loaded on the touch sensing IC 150 in the form of software and is carried out. Since the reset process should be carried out at a time different from a drive signal application time interval and a sensing signal reception time interval which are for detecting the touch pressure, the efficiency of the touch pressure detection may be deteriorated. Also, when input touch is maintained without being released, the reset process is not carried out during the period during which the input touch is maintained. Therefore, the change of the electrical characteristics due to the display noise during the period during which the input touch is maintained cannot be excluded.

Also, even though the reference electrical characteristics is reset to the reset time through the above-described reset process, pressure detection is performed within the time period during which the display is driven. Therefore, it is practically impossible to exclude the change of the electrical characteristics due to the display noise occurring in real time. Accordingly, there is a demand for a method for compensating in real time for the change of the electrical characteristics due to the display noise.

Hereinafter, a case where the electrical characteristic is a capacitance will be described. The pressure sensing unit in the form of the sensor sheet 440 shown in FIG. 3b according to the embodiment of the present invention or the pressure sensing unit shown in FIG. 3c which is formed directly on the display module 200 according to the embodiment of the present invention may include the pressure sensors 450 and 460 and a reference pressure sensor 480. Since the reference pressure sensor 480 can be disposed at a position where there is no distance change or a relatively very small distance change between the reference potential layer and the reference pressure sensor 480 even though the touch pressure is applied, the capacitance detected at the reference pressure sensor 480 is mainly changed only by the change of ambient environment including the display noise. Here, the magnitude of the pressured applied to the touch surface can be calculated by using the capacitance detected at the pressure sensors 450 and 460 and the capacitance detected at the reference pressure sensor 480. The magnitude of the pressured applied to the touch surface can be calculated based on the capacitance change amount $\Delta C_{m\_press}$ due to pure pressure. The capacitance change amount $\Delta C_{m\_press}$ due to pure pressure can be calculated by the following equation through the use of the capacitance $C_{m\_press\_electrode}$ detected at the pressure sensors 450 and 460 and the capacitance $C_{m\_press\_electrode}$ detected at the reference pressure sensor 480.

$$\Delta C_{m\_press} = \alpha_1 \times C_{m\_press\_electrode} - \alpha_2 \times C_{m\_reference\_electrode}$$

Here, $\alpha_1$ and $\alpha_2$ may be constants for compensating for the fundamental difference between the capacitance detected at the pressure sensors 450 and 460 used to detect the pressure and the capacitance detected at the reference pressure sensor 480. Specifically, since the capacitance is proportional to the area of the electrode, $\alpha_1$ and $\alpha_2$ may be a ratio of the area of the pressure sensors 450 and 460 used to detect the pressure to the area of the reference pressure sensor 480.

That is to say, the magnitude of the pressured applied to the touch surface can be calculated based on the difference between a reference capacitance $\alpha_2 \times C_{m\_reference\_electrode}$ calculated from the capacitance detected at the reference pressure sensor 480 and the detected capacitance $\alpha_1 \times C_{m\_press\_electrode}$ calculated from the capacitance detected at the pressure sensors 450 and 460 used to detect the pressure. Here, the value of $\alpha_1$ or $\alpha_2$ may be 1.

Specifically, as shown in FIGS. 3b to 3i, the reference pressure sensor 480 according to the embodiment of the present invention may be disposed outside the pressure sensors 450 and 460. When the reference pressure sensor 480 is disposed outside the pressure sensors 450 and 460, when the pressure is, as shown in FIG. 3d, applied to the touch surface, a distance change between the reference pressure sensor 480 and the reference potential layer is smaller than a distance change between the pressure sensors 450 and 460 disposed under the position where the pressure is applied and the reference potential layer. Therefore, the magnitude at which the capacitance detected at the reference pressure sensor 480 changes according to the distance change between the reference pressure sensor 480 and the reference potential layer is less than the magnitude at which the capacitance detected at the pressure sensors 450 and 460 changes according to the distance change between the pressure sensors 450 and 460 and the reference potential layer.

Also, the reference pressure sensor 480 may be disposed under the region where the screen of the touch input device 1000 is not displayed. When the reference pressure sensor 480 is disposed under the region where the screen of the touch input device 1000 is not displayed, the touch pressure is not recognized in the region where the reference pressure sensor 480 is disposed, that is, in the region where the screen is not displayed. Therefore, the capacitance detected at the reference pressure sensor 480 may not include the change of the capacitance due to the touch pressure.

Also, the reference pressure sensor 480 may be disposed under the region where the position of the touch input to the touch input device 1000 is not sensed. Specifically, the reference pressure sensor 480 may be disposed under the region other than the region where the drive electrode TX or the receiving electrode RX included in the touch sensor 10 shown in FIG. 1 is disposed. Also, the reference pressure sensor 480 may be disposed under a bezel area where a conductive trace which connects the drive electrode TX or the receiving electrode RX to the touch sensing IC 150 is disposed. Likewise, when the reference pressure sensor 480 is disposed under the region where the position of the touch input to the touch input device 1000 is not sensed, the touch pressure is not recognized in the region where the reference pressure sensor 480 is disposed. Therefore, the capacitance detected at the reference pressure sensor 480 may not include the change of the capacitance due to the touch pressure.

The frame 330 which is disposed at the border of the touch input device 1000 and separates the pressure sensors 450 and 460 from the reference potential layer may be made of an inelastic material. Therefore, even though the pressure is applied to the display module 200, the frame 330 is not deformed or is deformed very slightly depending on the pressure. Accordingly, when the reference pressure sensor 480 is, as shown in FIGS. 3*b* to 3*h*, disposed only at the border of the touch input device 1000, the capacitance which is detected at the reference pressure sensor 480 is mainly changed only in accordance with the change of the ambient environment including the display noise because there is no distance change between the reference pressure sensor 480 and the reference potential layer or the distance change between the reference pressure sensor 480 and the reference potential layer is relatively very small even though the touch pressure is applied. Specifically, as shown in FIGS. 3*d* and 3*g*, the reference pressure sensor 480 may be disposed at a position adjacent to the frame 330.

The foregoing has described, as shown in FIGS. 4*a* to 4*e*, 6*a* to 6*h*, or 8*a* to 8*b*, the touch input device 1000 in which that the pressure sensors 450 and 460 are formed on one side of the display module 200 or the substrate 300, and the reference potential layer is the display module 200 or the substrate 300, and the frame 330 which causes the reference potential layer and the pressure sensors 450 and 460 to be spaced apart from each other is disposed between the display module 200 and the substrate 300. However, the present invention is not limited to this. As shown in FIGS. 5*a* to 5*i*, this can be applied to a case where the reference potential layer is disposed within the display module 200 and the frame which causes the reference potential layer and the pressure sensors 450 and 460 to be spaced apart from each other is the display module frames 221, 221-1, and 221-2 or the frame which causes the reference potential layer and the pressure sensors 450 and 460 to be spaced apart from each other is, as shown in FIGS. 6*a* to 6*h*, the sensor sheet frame 430.

As shown in FIGS. 3*h* and 3*i*, the reference pressure sensor 480 may be composed of a plurality of electrodes. Specifically, the reference pressure sensor 480 may include a first reference pressure sensor 480-1, a second reference pressure sensor 480-2 and/or a third reference pressure sensor 480-3. When a pressure is applied to the reference pressure sensor 480 disposed at a position adjacent to the frame 330 shown in FIGS. 3*d* and 3*g*, the distance change between the reference pressure sensor 480 and the reference potential layer is small but not completely removed by the frame 330 without being deformed. On the other hand, the distance change between the reference potential layer and the reference pressure sensor 480 disposed at a position relatively far from the position where the pressure is applied is less than the distance change between the reference potential layer and the reference pressure sensor 480 disposed at a position relatively close to the position where the pressure is applied. Accordingly, depending on the position where the pressure is applied, the pressure detection accuracy can be further improved by using the reference pressure sensor 480 disposed at a position far from the position where the pressure is applied. For example, when the pressure is applied to a position P shown in FIG. 3*h*, the first reference pressure sensor 480-1 disposed at a position far from the position where the pressure is applied can be used as the reference pressure sensor.

The foregoing has described that the reference pressure sensor 480 is disposed at the entire border of the touch input device 1000. However, the reference pressure sensor 480 can be placed in any position.

Specifically, the reference potential layer may be disposed at a position which is representative of the change of the capacitance due to the noise or at a position adjacent to the position. For example, in the state where the pressure is not applied, the capacitance change amount due to the display noise is measured from each channel, and a channel representing the greatest capacitance change amount among the measured capacitance change amounts or a channel representing a capacitance change amount which is the most similar to the average value of the measured capacitance change amounts may be set as a representative channel. Here, the pressure sensor may be disposed only at a position closest to the representative channel. This can be, as shown in FIG. 3*h* or 3*i*, applied to the respective borders.

It has been described in FIGS. 3*b* to 3*i* that the pressure sensing unit includes separately the reference pressure electrode 480 which is distinguished from the pressure sensors 450 and 460. However, as shown in FIG. 3*j*, at least one of the plurality of pressure sensors 450 and 460 included in the pressure sensing unit can be used as a reference pressure sensor. Specifically, the pressure sensors 450 and 460 may include a first pressure sensor and a second pressure sensor. Here, in order to improve the pressure detection accuracy, the sensor disposed at a position farther from the position where the pressure is applied among the first pressure sensor and the second pressure sensor can be used as the reference pressure sensor. For example, when the pressure is applied to a position P shown in FIG. 3*j*, the pressure sensor R disposed at a position farther from the position where the pressure is applied can be used as the reference pressure sensor.

As shown in FIG. 3*k*, when the pressure is applied to a position P, the amplitude of a signal including information on the capacitance detected in the channel corresponding to the position P may be greater than the amplitude of a signal including information on the capacitance detected in the channel far from the position P. Here, the capacitance detected in each channel may change according to a variety of factors such as display noise, the change of the electric field or the magnetic field around the touch input device 1000, temperature change, etc., as well as the pressure applied to the touch input device 1000. The capacitance change due to the factors other than the pressure applied to the touch input device 1000 corresponds to noise to be removed in the detection of the pressure magnitude. Here, while, in the signals detected in the channel corresponding to the position P to which the pressure has been applied, a proportion that the amplitude of the signal due to the pressure occupies is larger than a proportion that the amplitude of the signal due to the noise occupies, in the signals detected in the channel far from the position P, to which the pressure has been applied, proportion that the amplitude of the signal due to the pressure occupies is relatively less than the proportion that the amplitude of the signal due to the noise occupies. Here, since the signal due to the noise is generally constant regardless of the position where the pressure is applied, the amplitude of the signal due to the noise detected in each channel is generally constant. However, the signal due to the pressure depends on the position where the pressure is applied, the signal due to the pressure detected in each channel depends on the position where the pressure is applied.

Therefore, in the detection of the pressure magnitude, by excluding a signal which is detected in a channel where the amplitude of the signal due to noise is relatively larger than the amplitude of the signal due to the pressure, or by reducing how much the signal contributes to the detection of the magnitude of the pressure, how much the amplitude of the signal due to noise is reduced is higher than how much the amplitude of the signal due to the pressure is reduced. Therefore, overall SNR can be improved.

Here, the position to which the pressure has been applied and the position where the display module shows the largest deformation do not necessarily match each other. However, generally, the display module is more greatly deformed at the position to which the pressure has been applied than other positions. Therefore, the amplitude of the signal including information on the capacitance detected in the channel corresponding to the position to which the pressure has been applied is generally greater than the amplitude of the signal including information on the capacitance detected in the channel corresponding to the other positions.

Only the channel in which N largest signals among the signals detected in each channel are detected can be used to detect the pressure. In this case, the pressure is detected by using only some channels in which the signal with a large amplitude is detected among all of the channels, and SNR can be improved by excluding the channel in which the signal with a small amplitude in detecting the pressure. Here, N is a natural number equal to or greater than 1 and equal to or smaller than the total number of the channels. Specifically, when a pressure is applied to the position "P" of FIG. 3k and N is 4, only the capacitance which is detected in the channels CH2, CH4, CH5, and CH8 of FIG. 3l in which four largest signals 50, 60, 110, and 90 are detected can be used as a detection capacitance $C_{m\_press\_electrode}$ to detect the pressure.

Also, the pressure can be detected by using only the channel in which a signal with an amplitude equal to or greater than a predetermined ratio of the amplitude of the largest signal among the signals detected in the respective channels is detected. In this case as well, the pressure is detected by using only some channels in which the signal with a large amplitude is detected among all of the channels, and SNR can be improved by excluding the channel in which the signal with a small amplitude in detecting the pressure. Specifically, when the pressure is applied to the position "P" of FIG. 3k and the predetermined ratio is 50%, only the capacitance which is detected in the channels CH4, CH5, and CH8 of FIG. 3l in which a signal with an amplitude equal to or greater than 55 that is 50% of the amplitude of the signal output from the channel CH5 in which the largest signal is detected is detected can be used as the detection capacitance $C_{m\_press\_electrode}$ to detect the pressure.

Also, only N channels which are the closest to the touch position can be used to detect the pressure. In this case, the amplitude of the signal detected in the channel close to the touch position is generally greater than the amplitude of the signal detected in the channel relatively far from the touch position. Therefore, the pressure is detected by using only some channels in which the signal with a large amplitude is detected among all of the channels, and SNR can be improved by excluding the channel in which the signal with a small amplitude in detecting the pressure. Here, N is a natural number equal to or greater than 1 and equal to or smaller than the total number of the channels. Specifically, when the pressure is applied to the position "P" and N is 4, only the capacitance which is detected in the four channels CH4, CH5, CH7, and CH8 of FIG. 3l which are the closest to the touch position can be used as a detection capacitance $C_{m\_press\_electrode}$ to detect the pressure.

Also, only the channel located within a predetermined distance from the touch position can be used to detect the pressure. In this case as well, the pressure is detected by using only some of the channels in which the signal having a large amplitude is detected among all of the channels, and SNR can be improved by excluding the channel in which the signal with a small amplitude in detecting the pressure. Specifically, when the pressure is applied to the position "P" of FIG. 3k and the predetermined distance is "r" shown in FIG. 3k, only the capacitance which is detected in the channels CH1, CH2, CH4, CH5, CH6, CH7, and CH8 of FIG. 3l located within the distance "r" from the touch position can be used as a detection capacitance $C_{m\_press\_electrode}$ to detect the pressure.

As described above, when only some of the channels among all of the channels are used to detect the pressure, the sensor corresponding to the channel which is not used to detect the pressure can be used as the reference pressure sensor. Specifically, the pressure sensors 450 and 460 may include the first pressure sensor and the second pressure sensor, and the second pressure sensor which is not used to detect the pressure can be used as the reference pressure sensor.

By using all of the sensors corresponding to the respective channels which are not used to detect the pressure as the reference pressure sensor, the average value of the capacitances detected in the respective channels can be used as the reference capacitance $C_{m\_reference\_electrode}$ detected at the reference pressure sensor.

Also, only some of the channels which are not used to detect the pressure are selected by a method similar to the above-described method for selecting the channel used to detect the pressure, and the sensor corresponding to the selected channel is used as the reference pressure sensor. The average value of the capacitances detected in the selected channels can be used as the reference capacitance $C_{m\_reference\_electrode}$ detected at the reference pressure sensor.

Here, only the sensor corresponding to the channel in which N largest signals or N smallest signals among signals detected in the respective channels which are not used to detect the pressure are detected can be used as the reference pressure sensor.

Specifically, based on a difference between the reference capacitance calculated from N smallest capacitances among the capacitances detected in the plurality of channels and the reference capacitance calculated from M largest capacitances among the capacitances detected in the plurality of channels, the magnitude of the pressure applied to the touch surface can be calculated. Here, M and N may be equal or not equal to each other.

For example, when the pressure is applied to the position "P" of FIG. 3k and M is 4, only the capacitance which is detected in the channels CH2, CH4, CH5, and CH8 of FIG. 3l in which four largest signals 50, 60, 110, and 90 are detected can be used to detect the pressure. When N is 4, the sensor corresponding to the channels CH12, CH13, CH14, and CH15 in which four smallest signals 10, 10, 5, and 2 are detected is used as the reference pressure sensor, and only the capacitance which is detected in the channels CH12, CH13, CH14, and CH15 can be used as the reference capacitance $C_{m\_reference\_electrode}$.

Also, only the sensor corresponding to the channel in which a signal with an amplitude equal to or greater than a predetermined ratio of the amplitude of the largest signal is detected among the signals detected in the respective channels which are not used to detect the pressure or only the sensor corresponding to the channel in which a signal with an amplitude equal to or less than a predetermined ratio of the amplitude of the largest signal is detected among the signals detected in the respective channels which are not used to detect the pressure can be used as the reference pressure sensor. Alternatively, among the channels which are not used to detect the pressure, only N channels which are the closest to the touch position or only N channels which are the farthest from the touch position can be used as the reference pressure sensor. Alternatively, among the channels which are not used to detect the pressure, only the channel located within a predetermined distance from the touch position or only the channel located apart from the touch position at a distance larger than the predetermined distance can be used as the reference pressure sensor.

Also, in the state where the pressure is not applied, the capacitance change amount due to the display noise is measured from each channel, and the representative channel order may be determined in the order of the channels representing the greatest capacitance change amount among the measured capacitance change amounts. Alternatively, representative channel order may be determined in the order of the channels representing a capacitance change amount which is the most similar to the average value of the measured capacitance change amounts. Here, the sensor corresponding to the highest order representative channel among the channels which are not used to detect the pressure can be used as the reference pressure sensor.

Also, in the state where the pressure is not applied, the capacitance change amount due to the display noise is measured from each channel, and N channels representing the greatest capacitance change amount among the measured capacitance change amounts are set as the representative channel. Alternatively, N channels representing a capacitance change amount which is the most similar to the average value of the measured capacitance change amounts are set as the representative channel. Here, the sensor corresponding to the representative channel among the channels which are not used to detect the pressure can be used as the reference pressure sensor. When the reference pressure sensor is provided in the plural form, the average value of the capacitances detected in the corresponding channel can be used as the reference capacitance $C_{m\_reference\_electrode}$ detected at the reference pressure sensor. Also, among the sensors corresponding to the channels which are not used to detect the pressure and are representative channels, only a sensor corresponding to the farthest position from the touch position can be used as the reference pressure sensor.

Also, when N channels are, as described above, set as the representative channel, the touch area is divided into a plurality of detailed areas, and the representative channel may be set such that one representative channel is assigned to each detailed area. Here, likewise, only a sensor corresponding to the farthest position from the touch position can be used as the reference pressure sensor. Specifically, the touch area may be divided into four up, down, right and left areas, and one representative channel may be assigned to each area. For example, CH2, CH7, CH9, and CH14 of FIG. 3*l* may be set as the representative channel, and when the pressure is applied to the position "P" of FIG. 3*l*, the sensor corresponding to CH14 which is the farthest from the position "P" may be used as the reference pressure sensor.

In the touch input device 1000 shown in FIG. 3*m*, the pressure sensing unit, like a piezoelectric sensor, which detects the pressure by its physical properties such as voltage, resistance, or the like, changed by a pressure transmitted directly to the pressure sensing unit, may include a pressure sensor 650 and a reference pressure sensor 680. Here, as shown in FIG. 3*m*, when the reference pressure sensor 680 is disposed only at the border of the touch input device 1000 and the height of the reference pressure sensor 680 is made less than that of the pressure sensor 650 such that the display module 200 does not contact the reference pressure sensor 680 even though the touch pressure is applied, the physical properties detected at the reference pressure sensor 680 changes only in accordance with the change of ambient environment including display noise. Similarly, a reference property is calculated from the property detected by the reference pressure sensor 680, the magnitude of the pressure applied to the touch surface can be calculated from a difference between the reference property and the property detected by the pressure sensor 650.

As described above, in order to detect the pressure through the touch input device 1000 to which the pressure sensing unit is applied according to the embodiment of the present invention, it is necessary to sense the capacitance change occurring in the pressure sensors 450 and 460. Therefore, it is necessary for the drive signal to be applied to the drive sensor out of the first and second sensors 450 and 460, and it is required to detect the touch pressure by the capacitance change amount by obtaining the sensing signal from the receiving sensor. According to the embodiment, it is possible to additionally include a pressure detection device in the form of a pressure sensing IC for the operation of the pressure detection. The pressure detection module 400 according to the embodiment of the present invention may include not only the pressure sensing unit for pressure detection but also the pressure detection device.

In this case, the touch input device repeatedly has a configuration similar to the configuration of FIG. 1 including the drive unit 12, the sensing unit 11, and the controller 13, so that the area and volume of the touch input device 1000 increase.

According to the embodiment, the touch detection device 1000 may apply the drive signal for pressure detection to the pressure sensing unit by using the touch detection device for the operation of the touch sensor 10, and may detect the touch pressure by receiving the sensing signal from the pressure sensing unit. Hereinafter, the following description will be provided by assuming that the first sensor 450 is the drive sensor and the second sensor 460 is the receiving sensor.

For this, in the touch input device 1000 to which the pressure sensing unit is applied according to the embodiment of the present invention, the drive signal may be applied to the first sensor 450 from the drive unit 12, and the second sensor 460 may transmit the sensing signal to the sensing unit 11. The controller 13 may perform the scanning of the touch sensor 10, and simultaneously perform the scanning of the touch pressure detection, or the controller 13 performs the time-sharing, and then may generate a control signal such that the scanning of the touch sensor 10 is performed in a first time interval and the scanning of the pressure detection is performed in a second time interval different from the first time interval.

Therefore, in the embodiment of the present invention, the first sensor 450 and the second sensor 460 should be electrically connected to the drive unit 12 and/or the sensing unit 11. Here, it is common that the touch detection device for the touch sensor 10 corresponds to a touch sensing IC 150 and is formed on one end of the touch sensor 10 or on the same plane with the touch sensor 10. The pressure sensors 450 and 460 included in the pressure sensing unit may be electrically connected to the touch detection device of the touch sensor 10 by any method. For example, the pressure sensors 450 and 460 may be connected to the touch detection device through a connector by using a second PCB 210 included in the display module 200. For example, the conductive traces which electrically extend, as shown in FIGS. 4*b* and 5*c*, from the first sensor 450 and the second sensor 460 respectively may be connected even to the touch sensing IC 150 through the second PCB 210, etc.

FIGS. 11a to 11b show that pressure sensing unit in the form of the sensor sheet 440 including the pressure sensors 450 and 460 is attached to the bottom surface of the display module 200. FIGS. 11a and 11b show the second PCB 210 on which a circuit for the operation of the display panel has been mounted is disposed on a portion of the bottom surface of the display module 200.

FIG. 11a shows that the sensor sheet 440 is attached to the bottom surface of the display module 200 such that the first sensor 450 and the second sensor 460 are connected to one end of the second PCB 210 of the display module 200. Here, the first sensor 450 and the second sensor 460 may be connected to the one end of the second PCB 210 by using a double conductive tape. Specifically, since the thickness of the sensor sheet 440 and an interval between the substrate 300 and the display module 200 where the sensor sheet 440 is disposed are very small, the thickness can be effectively reduced by connecting both the first sensor 450 and the second sensor 460 to the one end of the second PCB 210 by using the double conductive tape rather than by using a separate connector. A conductive pattern may be printed on the second PCB 210 in such a manner as to electrically connect the pressure sensors 450 and 460 to a necessary component like the touch sensing IC 150, etc. The detailed description of this will be provided with reference to FIGS. 12a to 12c. An attachment method of the sensor sheet 440 including the pressure sensors 450 and 460 shown in FIG. 11a can be applied in the same manner to the substrate 300.

FIG. 11b shows that the first sensor 450 and the second sensor 460 are not manufactured of a separate sensor sheet but are integrally formed on the second PCB 210 of the display module 200. For example, when the second PCB 210 of the display module 200 is manufactured, a certain area is separated from the second PCB, and then not only the circuit for the operation of the display panel but also the pattern corresponding to the first sensor 450 and the second sensor 460 can be printed on the area. A conductive pattern may be printed on the second PCB 210 in such a manner as to electrically connect the first sensor 450 and the second sensor 460 to a necessary component like the touch sensing IC 150, etc.

FIGS. 12a to 12c show a method for connecting the pressure sensors 450 and 460 or the sensor sheet 440 to the touch sensing IC 150. In FIGS. 12a to 12c, the touch sensor 10 is included outside the display module 200. FIGS. 12a to 12c show that the touch detection device of the touch sensor 10 is integrated in the touch sensing IC 150 mounted on the first PCB 160 for the touch sensor 10.

FIG. 12a shows that the pressure sensors 450 and 460 attached to the display module 200 are connected to the touch sensing IC 150 through a first connector 121. As shown in FIG. 12a, in a mobile communication device such as a smart phone, the touch sensing IC 150 is connected to the second PCB 210 for the display module 200 through the first connector 121. The second PCB 210 may be electrically connected to the main board through a second connector 224. Therefore, through the first connector 121 and the second connector 224, the touch sensing IC 150 may transmit and receive a signal to and from the CPU or AP for the operation of the touch input device 1000.

Here, while FIG. 12a shows that the sensor sheet 440 is attached to the display module 200 by the method shown in FIG. 11b, the sensor sheet 440 can be attached to the display module 200 by the method shown in FIG. 11a. A conductive pattern may be printed on the second PCB 210 in such a manner as to electrically connect the first sensor 450 and the second sensor 460 to the touch sensing IC 150 through the first connector 121.

FIG. 12b shows that the pressure sensors 450 and 460 attached to the display module 200 are connected to the touch sensing IC 150 through a third connector 473. In FIG. 12b, the pressure sensors 450 and 460 may be connected to the main board for the operation of the touch input device 1000 through the third connector 473, and in the future, may be connected to the touch sensing IC 150 through the second connector 224 and the first connector 121. Here, the pressure sensors 450 and 460 may be printed on the additional PCB separated from the second PCB 210. Otherwise, according to the embodiment, the pressure sensors 450 and 460 may be attached to the touch input device 1000 in the form of the sensor sheet 440 shown in FIGS. 3b to 3i and may be connected to the main board through the connector 473 by extending the conductive trace, etc., from the pressure sensors 450 and 460.

FIG. 12c shows that the pressure sensors 450 and 460 are directly connected to the touch sensing IC 150 through a fourth connector 474. In FIG. 12c, the pressure sensors 450 and 460 may be connected to the first PCB 160 through the fourth connector 474. A conductive pattern may be printed on the first PCB 160 in such a manner as to electrically connect the fourth connector 474 to the touch sensing IC 150. As a result, the pressure sensors 450 and 460 may be connected to the touch sensing IC 150 through the fourth connector 474. Here, the pressure sensors 450 and 460 may be printed on the additional PCB separated from the second PCB 210. The second PCB 210 may be insulated from the additional PCB so as not to be short-circuited with each other. Also, according to the embodiment, the pressure sensors 450 and 460 may be attached to the touch input device 1000 in the form of the sensor sheet 440 shown in FIGS. 3b to 3i and may be connected to the first PCB 160 through the fourth connector 474 by extending the conductive trace, etc., from the pressure sensors 450 and 460. Also, while FIG. 12c shows that the pressure sensors 450 and 460 are connected to the first PCB 160 through the fourth connector 474, the pressure sensors 450 and 460 may be connected to the second PCB 210 through the fourth connector 474.

The connection method of FIGS. 12b and 12c can be applied to the case where the pressure sensors 450 and 460 are formed on the substrate 300 as well as on the bottom surface of the display module 200.

FIGS. 12a to 12c have been described by assuming that a chip on board (COB) structure in which the touch sensing IC 150 is formed on the first PCB 160. However, this is just an example. The present invention can be applied to the chip on board (COB) structure in which the touch sensing IC 150 is mounted on the main board within the mounting space 310 of the touch input device 1000. It will be apparent to those skilled in the art from the descriptions of FIGS. 12a to 12c that the connection of the pressure sensors 450 and 460 through the connector can be also applied to another embodiment.

The foregoing has described the pressure sensors 450 and 460, that is to say, has described that the first sensor 450 constitutes one channel as the drive sensor and the second sensor 460 constitutes one channel as the receiving sensor. However, this is just an example. According to the embodiment, the drive sensor and the receiving sensor constitute a plurality of channels respectively, so that it is possible to detect multi pressure according to multi touch.

FIGS. 13a to 13d show that the pressure sensor of the present invention constitutes the plurality of channels. FIG. 13a shows first sensors 450-1 and 450-2 and second sensors 460-1 and 460-2 constitute two channels respectively. Though FIG. 13a shows that the first sensor 450-1 and the second sensor 460-1 which constitute a first channel are included in the first sensor sheet 440-1 and the first sensor 450-2 and the second sensor 460-2 which constitute a second channel are included in the second sensor sheet 440-2, all of the first sensors 450-1 and 450-2 and the second sensors 460-1 and 460-2 which constitute the two channels may be included in one sensor sheet 440. FIG. 13b shows that the first sensors 450-1 and 450-2 constitute two channels and the second sensor 460 constitutes one channel FIG. 13c shows the first sensors 450-1 to 450-5 constitute five channels and the second sensors 460-1 to 460-5 constitute five channels. Even in this case, all of the sensors constituting the five channels may be also included in one sensor sheet 440. FIG. 13d shows that first sensors 451 to 459 constitute nine channels and all of the first sensors 451 to 459 are included in one sensor sheet 440.

As shown in FIGS. 13a to 13d and 15a to 15c, when the plurality of channels are formed, a conductive pattern which is electrically connected to the touch sensing IC 150 from each of the first sensor 450 and/or the second sensor 460 may be formed.

Here, described is a case in which the plurality of channels shown in FIG. 13d are constituted. In this case, since a plurality of conductive patterns 461 should be connected to the first connector 121 with a limited width, a width of the conductive pattern 461 and an interval between the adjacent conductive patterns 461 should be small Polyimide is more suitable for a fine process of forming the conductive pattern 461 with such a small width and interval than polyethylene terephthalate. Specifically, the first insulation layer 470 or the second insulation layer 471 of the sensor sheet 440, in which the conductive pattern 461 is formed, may be made of polyimide. Also, a soldering process may be required to connect the conductive pattern 461 to the first connector 121. For a soldering process which is performed at a temperature higher than 300° C., polyimide resistant to heat is more suitable than polyethylene terephthalate relatively vulnerable to heat. Here, for the purpose of reducing production costs, a portion of the first insulation layer 470 or the second insulation layer 471, in which the conductive pattern 461 is not formed, may be made of polyethylene terephthalate, and a portion of the first insulation layer 470 or the second insulation layer 471, in which the conductive pattern 461 is formed, may be made of polyimide.

FIGS. 13a to 13d and 15a to 15c show that the pressure sensor constitutes a single or a plurality of channels. The pressure sensor may be comprised of a single or a plurality of channels by a variety of methods. While FIGS. 13a to 13c and 15a to 15c do not show that the pressure sensors 450 and 460 are electrically connected to the touch sensing IC 150, the pressure sensors 450 and 460 can be connected to the touch sensing IC 150 by the method shown in FIGS. 12a to 12c and other methods.

In the foregoing description, the first connector 121 or the fourth connector 474 may be a double conductive tape. Specifically, since the first connector 121 or the fourth connector 474 may be disposed at a very small interval, the thickness can be effectively reduced by using the double conductive tape rather than a separate connector.

The foregoing has described that the pressure sensor 450 included in the pressure sensing unit is composed of the electrode and, as the electrical characteristic sensed by the pressure sensing unit, the capacitance change amount due to the bending of the display panel 200A is detected, so that the magnitude of the pressure is detected. However, the embodiment of the present invention is not limited to this. The pressure sensor 450 included in the pressure sensing unit may be composed of a strain gauge and, as the electrical characteristic sensed by the pressure sensing unit, the change amount of the resistance value of the pressure sensor 450, which changes according to the bending of the display panel 200A is detected, so that the magnitude of the pressure is detected. Even in this case, the above-described method can be applied in the same manner.

Although embodiments of the present invention were described above, these are just examples and do not limit the present invention. Further, the present invention may be changed and modified in various ways, without departing from the essential features of the present invention, by those skilled in the art. For example, the components described in detail in the embodiments of the present invention may be modified. Further, differences due to the modification and application should be construed as being included in the scope and spirit of the present invention, which is described in the accompanying claims

| REFERENFCE NUMERALS | |
|---|---|
| 1000: touch input device | 10: touch sensor |
| 12: drive unit | 11: sensing unit |
| 13: controller | 200: display module |
| 300: substrate | 400: pressure detection module |
| 420; spacer layer | 440: sensor sheet |
| 450, 460: pressure sensor | 470: first insulation layer |
| 471: second insulation layer | 330: frame |
| 480: reference pressure sensor | |

The invention claimed is:

1. A touch input device capable of detecting a pressure of a touch on a touch surface, the touch input device comprising:
   a display panel;
   a substrate disposed under the display panel; and
   a pressure sensing unit, wherein the pressure sensing unit comprises a plurality of pressure sensors, wherein, when a pressure is applied to the touch surface, the display panel is bent,
   wherein the plurality of pressure sensors constitute a plurality of channels comprising a first channel and a second channel,
   wherein electrical characteristics detected in the first channel and the second channel change by the bending of the display panel,
   wherein a magnitude of the pressure applied to the touch surface is calculated based on a difference between a reference electrical characteristic calculated from the electrical characteristics detected in the channel disposed at a position relatively far from a position where the pressure is applied among the first channel and the second channel and the detected electrical characteristic calculated from the electrical characteristics detected in the channel disposed at a position relatively close to the position where the pressure is applied among the first channel and the second channel; and
   wherein the first channel and second channel are changed according to the position where the pressure is applied.

2. The touch input device of claim 1, further comprising a frame which is made of an inelastic material and separates the pressure sensor and a reference potential layer, wherein the frame is disposed at a border of the touch input device, and wherein the first channel or the second channel is disposed at a position adjacent to the frame.

3. The touch input device of claim 1, wherein the channel disposed at a position relatively far from the position where the pressure is applied among the first channel and the second channel is disposed at a position which is representative of electrical characteristic change due to noise.

4. The touch input device of claim 1,
wherein the pressure sensing unit further comprises a first insulation layer and a second insulation layer,
wherein the first pressure sensor and the second pressure sensor are disposed between the first insulation layer and the second insulation layer,
and wherein the pressure sensing unit is attached to the substrate or the display module comprising the display panel.

5. The touch input device of claim 1, wherein the pressure sensing unit is directly formed on the display panel.

6. The touch input device of claim 1, wherein multi pressure for multi touch is detectable by using the plurality of channels.

7. A touch input device capable of detecting a pressure of a touch on a touch surface, the touch input device comprising:
a display panel;
a substrate disposed under the display panel; and
a pressure sensing unit,
wherein the pressure sensing unit comprises a plurality of pressure sensors,
wherein, when a pressure is applied to the touch surface, the display panel is bent,
wherein the plurality of pressure sensors constitute a plurality of channels,
wherein electrical characteristics detected in the plurality of channels change by the bending of the display panel,
wherein a magnitude of the pressure applied to the touch surface is calculated based on a difference between a reference electrical characteristic calculated from N smallest electrical characteristics and the detected electrical characteristic calculated from M largest electrical characteristics among the electrical characteristics detected in the plurality of channels; and
wherein channels in which the N smallest electrical characteristics are detected and channels in which the M largest electrical characteristics are detected change according to a position where the pressure is applied.

8. The touch input device of claim 7, further comprising a frame which is made of an inelastic material and separates the pressure sensor and a reference potential layer,
wherein the frame is disposed at a border of the touch input device,
and wherein the plurality of channels is disposed at a position adjacent to the frame.

9. The touch input device of claim 7,
wherein the pressure sensing unit further comprises a first insulation layer and a second insulation layer,
wherein the pressure sensor is disposed between the first insulation layer and the second insulation layer,
and wherein the pressure sensing unit is attached to the substrate or the display module comprising the display panel.

10. The touch input device of claim 7, wherein the pressure sensing unit is directly formed on the display panel.

11. The touch input device of claim 7, wherein multi pressure for multi touch is detectable by using the plurality of channels.

12. A touch input device capable of detecting a pressure of a touch on a touch surface, the touch input device comprising:
a display panel;
a substrate disposed under the display panel; and
a pressure sensing unit,
wherein the pressure sensing unit comprises a plurality of pressure sensors,
wherein, when a pressure is applied to the touch surface, the display panel is bent,
wherein the plurality of pressure sensors constitute a plurality of channels comprising a first channel and a second channel,
wherein electrical characteristics detected in the first channel and the second channel change by the bending of the display panel,
wherein a magnitude of the pressure applied to the touch surface is calculated based on a difference between a reference electrical characteristic calculated from the electrical characteristics detected in the channel disposed at a position relatively far from a position where the pressure is applied among the first channel and the second channel and the detected electrical characteristic calculated from the electrical characteristics detected in the channel disposed at a position relatively close to the position where the pressure is applied among the first channel and the second channel, and
wherein the channel disposed at a position relatively far from a position where the pressure is applied among the first channel and the second channel is not used to calculate the magnitude of the pressure applied to the touch surface.

13. The touch input device of claim 12, further comprising a frame which is made of an inelastic material and separates the pressure sensor and a reference potential layer,
wherein the frame is disposed at a border of the touch input device,
and wherein the first channel or the second channel is disposed at a position adjacent to the frame.

14. The touch input device of claim 12, wherein the channel disposed at a position relatively far from the position where the pressure is applied among the first channel and the second channel is disposed at a position which is representative of electrical characteristic change due to noise.

15. The touch input device of claim 12,
wherein the pressure sensing unit further comprises a first insulation layer and a second insulation layer,
wherein the first pressure sensor and the second pressure sensor are disposed between the first insulation layer and the second insulation layer,
and wherein the pressure sensing unit is attached to the substrate or the display module comprising the display panel.

16. The touch input device of claim 12, wherein the pressure sensing unit is directly formed on the display panel.

17. The touch input device of claim 12, wherein multi pressure for multi touch is detectable by using the plurality of channels.

* * * * *